(12) United States Patent
Chuang et al.

(10) Patent No.: US 11,270,953 B2
(45) Date of Patent: Mar. 8, 2022

(54) STRUCTURE AND FORMATION METHOD OF CHIP PACKAGE WITH SHIELDING STRUCTURE

(71) Applicant: Taiwan Semiconductor Manufacturing Co., Ltd., Hsinchu (TW)

(72) Inventors: Po-Yao Chuang, Hsin-Chu (TW); Po-Hao Tsai, Zhongli (TW); Shin-Puu Jeng, Hsinchu (TW); Shuo-Mao Chen, New Taipei (TW); Ming-Chih Yew, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 97 days.

(21) Appl. No.: 16/284,630

(22) Filed: Feb. 25, 2019

(65) Prior Publication Data

US 2020/0075503 A1    Mar. 5, 2020

Related U.S. Application Data

(60) Provisional application No. 62/725,675, filed on Aug. 31, 2018.

(51) Int. Cl.
*H01L 23/552* (2006.01)
*H01L 23/538* (2006.01)
(Continued)

(52) U.S. Cl.
CPC ........ *H01L 23/552* (2013.01); *H01L 21/4817* (2013.01); *H01L 21/4857* (2013.01); *H01L 21/56* (2013.01); *H01L 23/3128* (2013.01); *H01L 23/49811* (2013.01); *H01L 23/49816* (2013.01); *H01L 23/49822* (2013.01); *H01L 23/5383* (2013.01); *H01L 23/5389* (2013.01);
(Continued)

(58) Field of Classification Search
CPC ............... H01L 23/552; H01L 23/3121; H01L 23/3128; H01L 23/5389; H01L 23/481; H01L 25/066–0657; H01L 2924/3025; H01L 2225/06537; H01L 2225/06548; H01L 23/49827; H01L 23/5384; H01L 23/49838; H01L 23/5386; H05K 1/0216–0227
See application file for complete search history.

(56) References Cited

U.S. PATENT DOCUMENTS 9,000,584 B2  4/2015  Lin et al.
9,048,222 B2  6/2015  Hung et al.
(Continued)

*Primary Examiner* — Yu Chen
(74) *Attorney, Agent, or Firm* — Birch, Stewart, Kolasch & Birch, LLP

(57) ABSTRACT

Structures and formation methods of a chip package are provided. The method includes forming multiple conductive structures over a carrier substrate. The method also includes disposing a semiconductor die over the carrier substrate such that the conductive structures surround the semiconductor die. The method further includes forming a protective layer to surround the conductive structures and the semiconductor die. In addition, the method includes disposing a shielding element over the semiconductor die and the conductive structures. The shielding element is electrically connected to the conductive structures.

20 Claims, 22 Drawing Sheets

(51) Int. Cl.
  *H01L 25/065* (2006.01)
  *H01L 23/31* (2006.01)
  *H01L 21/48* (2006.01)
  *H01L 25/00* (2006.01)
  *H01L 21/56* (2006.01)
  *H05K 1/02* (2006.01)
  *H01L 23/498* (2006.01)
  *H01L 25/16* (2006.01)
  *H01L 23/00* (2006.01)

(52) U.S. Cl.
  CPC ........ *H01L 25/0655* (2013.01); *H01L 25/165* (2013.01); *H01L 25/50* (2013.01); *H05K 1/0218* (2013.01); *H05K 1/0225* (2013.01); *H01L 23/49877* (2013.01); *H01L 24/16* (2013.01); *H01L 24/30* (2013.01); *H01L 24/73* (2013.01); *H01L 24/92* (2013.01); *H01L 2223/6677* (2013.01); *H01L 2224/16227* (2013.01); *H01L 2224/30181* (2013.01); *H01L 2224/73253* (2013.01); *H01L 2224/92125* (2013.01); *H01L 2224/92225* (2013.01); *H01L 2924/14215* (2013.01); *H01L 2924/16251* (2013.01)

(56) References Cited

U.S. PATENT DOCUMENTS

| | | | |
|---|---|---|---|
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2010/0276792 | A1* | 11/2010 | Chi ............... H01L 23/3128 257/660 |
| 2011/0140247 | A1* | 6/2011 | Pagaila ............ H01L 25/03 257/659 |
| 2012/0313226 | A1* | 12/2012 | Koizumi ........... H01L 24/19 257/659 |
| 2017/0012008 | A1* | 1/2017 | Yasooka .......... H01L 23/552 |
| 2018/0374798 | A1* | 12/2018 | Lee .................. H01L 23/552 |
| 2019/0035706 | A1* | 1/2019 | Watanabe ......... H01L 21/568 |
| 2019/0181126 | A1* | 6/2019 | Cheah ............ H01L 23/49822 |
| 2019/0274212 | A1* | 9/2019 | Otsubo ............... H05K 9/00 |

\* cited by examiner

STRUCTURE AND FORMATION METHOD OF CHIP PACKAGE WITH SHIELDING STRUCTURE

PRIORITY CLAIM AND CROSS-REFERENCE

This application claims the benefit of U.S. Provisional Application No. 62/725,675, filed on Aug. 31, 2018, the entirety of which is incorporated by reference herein.

BACKGROUND

Semiconductor devices are used in a variety of electronic applications, such as personal computers, cell phones, digital cameras, and other electronic equipment. The fabrication of the semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, which utilize less area or have lower heights, are developed to package the semiconductor devices.

New packaging technologies have been developed to improve the density and functionality of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
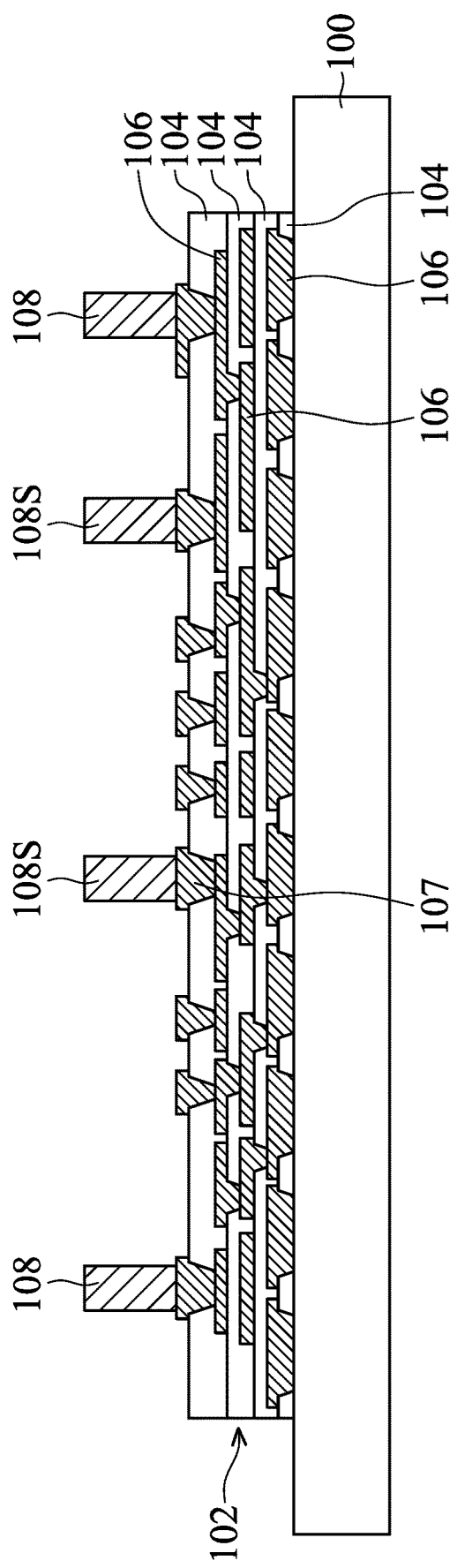
FIGS. 1A-1F are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may be applied in 3D packaging or 3D IC devices. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1F are cross-sectional views of various stages of a process for forming a chip package, in accordance with some embodiments. As shown in FIG. 1A, an interconnection structure 102 is formed over the carrier substrate 100, in accordance with some embodiments. The interconnection structure 102 may be used as a redistribution structure for routing. The interconnection structure 102 includes multiple insulating layers 104 and multiple conductive features 106, as shown in FIG. 1A. The conductive features 106 may include conductive lines, conductive vias, and/or conductive pads. The interconnection structure 102 also includes conductive features 107 that are used to hold or receive other elements such as conductive pillars or semiconductor dies.

In some embodiments, some of the conductive features 107 are exposed at or protrude from the topmost surface of the insulating layers 104. The exposed or protruding conductive features 107 may serve as bonding pads where conductive bumps (such as tin-containing solder bumps) and/or conductive pillars (such as copper pillars) will be formed later.

The insulating layers 104 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, graphene, one or more other suitable conductive materials, or a combination thereof.

The formation of the interconnection structure 102 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

However, many variations and/or modifications can be made to embodiments of the disclosure. In some other embodiments, the interconnection structure 102 is not formed.

Afterwards, conductive structures 108 and 108S are formed over some of the conductive features 107, as shown in FIG. 1A in accordance with some embodiments. In some embodiments, the conductive structures 108 are used for signal transmission. In some embodiments, the conductive structures 108S are used as a shielding structure capable of preventing electromagnetic interference (EMI) caused by a semiconductor die that will be disposed later.

In some embodiments, the conductive structures 108 and 108S are conductive pillars. In some embodiments, the conductive structures 108 and 108S have substantially straight sidewalls. The sidewalls of the conductive structures 108 and 108S may be substantially perpendicular to the top surface of the carrier substrate 100. The conductive structures 108 and 108S may be made of or include copper, aluminum, titanium, cobalt, gold, tin-containing alloys, one or more other suitable materials, or a combination thereof.

The conductive structures 108 and 108S may be formed using an electroplating process, an electroless plating process, a PVD process, a CVD process, one or more other applicable processes, or a combination thereof. In some other embodiments, the conductive structures 108 and 108S are picked and placed onto the exposed conductive features 107. Tin-containing solder elements may be used to affix the conductive structures 108 and 108S. In some embodiments, the conductive structures 108 and 108S are simultaneously formed. In some other embodiments, the conductive structures 108 and 108S are separately formed. For example, the conductive structures 108 are formed before the conductive structures 108S. Alternatively, the conductive structures 108S are formed before the conductive structures 108.

Figure 1B:
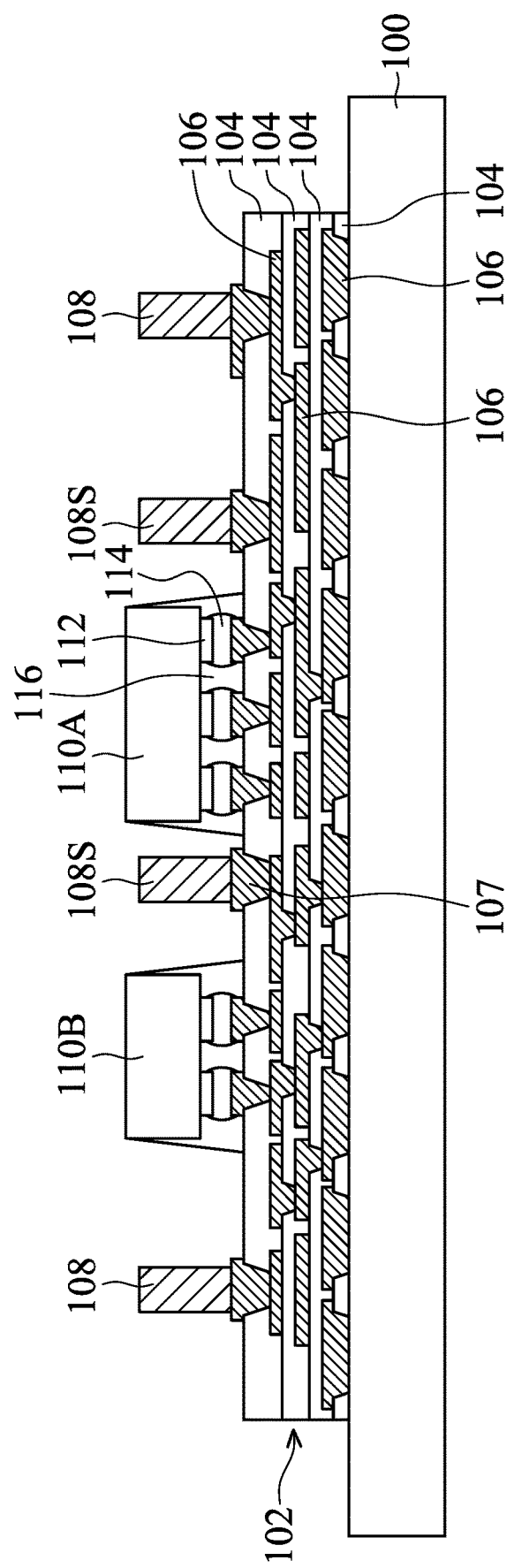

As shown in FIG. 1B, semiconductor device such as a semiconductor dies 110A and 110B are disposed over the carrier substrate 100, in accordance with some embodiments. The semiconductor die 110B is disposed outside of an area that is surrounded by the conductive structures 108S, as shown in FIG. 1B.

In some embodiments, the semiconductor dies 110A and 110B are disposed onto some of the exposed conductive features 107. The semiconductor dies 110A and 110B may be a system-on-chip (SoC) chip. In some other embodiments, the element 110A or 110B is a system on integrated circuit (SoIC) device that includes two or more chips with integrated function. In these cases, the reference number "110A or 110B" is used to designate a semiconductor device. The semiconductor device may include one die, multiple dies, or system-on-integrated-circuit chip device. For example, one or two of the elements 110A and 110B include a stack of multiple semiconductor dies.

In some embodiments, the semiconductor die 110A includes radio-frequency integrated circuits (RF-IC) such as radio-frequency front end (RFFE) modules. The operation frequency of the semiconductor die 110A is in the radio-frequency range. An electromagnetic wave having the wavelength corresponding to the operation frequency may be generated by the semiconductor die 110A during operation. For example, the operation frequency of the semiconductor die 110A may be about 28 GHz. In these cases, electromagnetic wave having a wavelength of about 10.7 mm may be generated by the semiconductor die 110A during operation. For example, the electromagnetic wave may be transmitted through the protective substrate 20. In some cases, the generated electromagnetic wave may negatively affect the operation of nearby device elements (such as the semiconductor die 110B or another device element in another nearby chip package). In some embodiments, shielding structures and/or shielding elements are formed later to prevent the generated electromagnetic wave from reaching nearby device elements and affecting the operation of the nearby device elements.

In some embodiments, the semiconductor die 110B includes low-noise amplifier (LNA) modules, low-loss filter modules, power amplifier (PA) modules, baseband modules, power management integrated circuit (PMIC), memory modules, micro-electromechanical system (MEMS) modules, nano-electromechanical systems (NEMS) modules, one or more other suitable circuits, or a combination thereof. In some embodiments, the semiconductor die 110B does not include any radio-frequency integrated circuit.

In some embodiments, the semiconductor dies 110A and 110B are disposed over the interconnection structure 102 formed over the carrier substrate 100. In some embodiments, the semiconductor dies 110A and 110B are bonded to some of the conductive features 107 of the interconnection structure 102 through bonding structures 114. The bonding structures 114 may physically and electrically connect some of the conductive features 107 and conductive features 112 of the semiconductor dies 110A and 110B. The conductive features 112 of the semiconductor dies 110A and 110B may include conductive pads, conductive pillars, conductive traces, or the like.

In some embodiments, the bonding structures 114 are or include solder bumps such as tin-containing solder bumps. The tin-containing solder bumps may further include copper, silver, gold, aluminum, lead, one or more other suitable materials, or a combination thereof. In some embodiments, the tin-containing solder bump is lead free. The formation of the bonding structures 114 may involve one or more reflow processes and/or one or more plating processes.

As shown in FIG. 1B, underfill elements 116 are formed to protect the bonding structures 114, in accordance with some embodiments. The underfill elements 116 are made of or include one or more polymer materials. The underfill elements 116 may include an epoxy-based resin. In some embodiments, the underfill elements 116 further include fillers dispersed in the epoxy-based resin. In some embodiments, the formation of the underfill elements 116 involves an injecting process, a dispensing process, a film lamination process, an application process, one or more other applicable processes, or a combination thereof. In some embodiments, a thermal curing process is then used to complete the formation of the underfill elements 116.

Figure 1C:
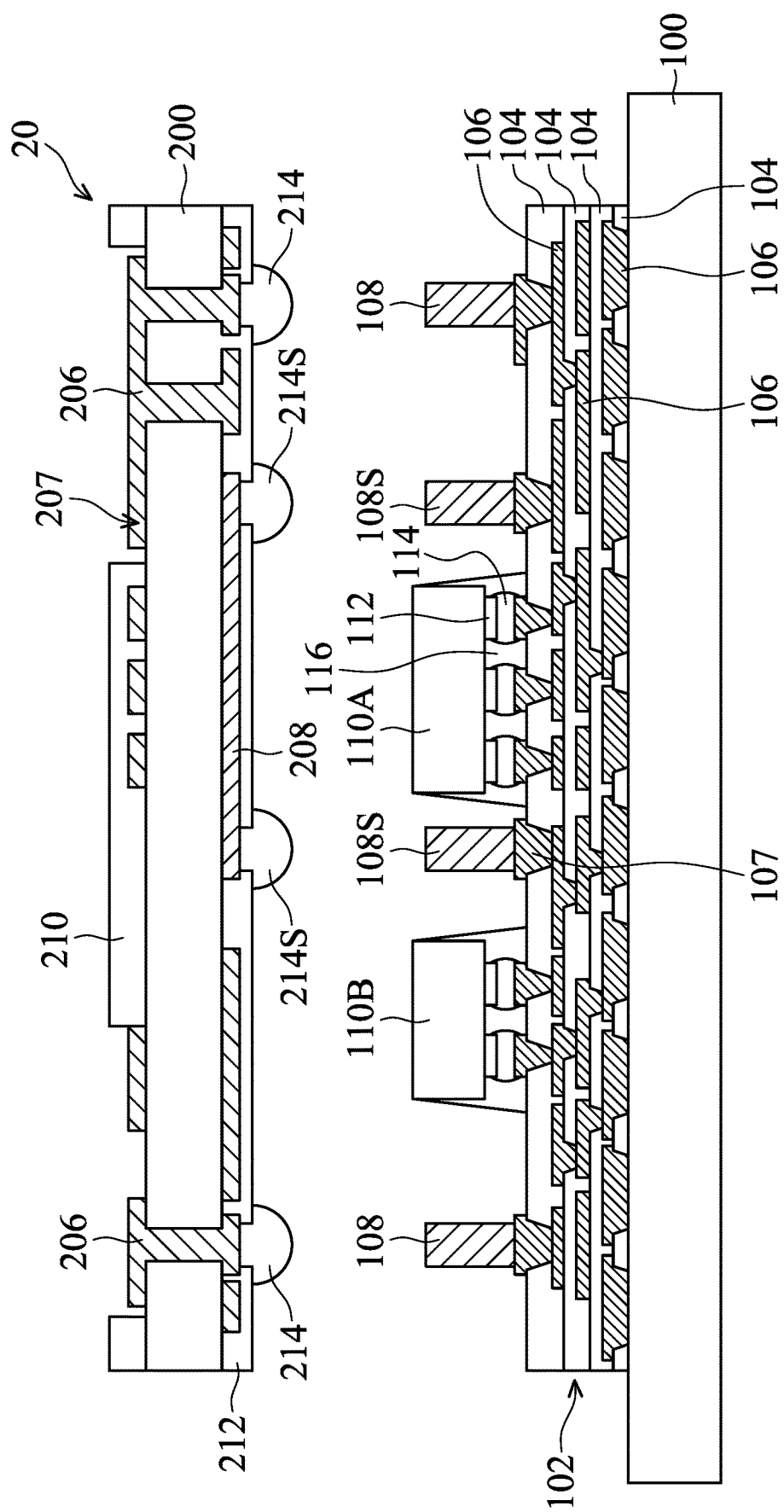

As shown in FIG. 1C, a protective substrate 20 is provided or received and is ready to be bonded onto the conductive structures 108 and 108S, in accordance with some embodiments. In some embodiments, the protective substrate 20 includes a board 200 and a shielding element 208. In some embodiments, the protective substrate 20 also includes conductive elements 214 and 214S. In some embodiments, the protective substrate 20 includes antenna elements, main patch elements, parasitic patch elements, ground elements, one or more other suitable elements, or a combination thereof.

FIGS. 2A-2E are cross-sectional views of various stages of a process for forming a chip package, in accordance with some embodiments. In some embodiments, the protective substrate 20 in FIG. 1C is formed using the process illustrated in FIGS. 2A-2E.

Figure 2A:
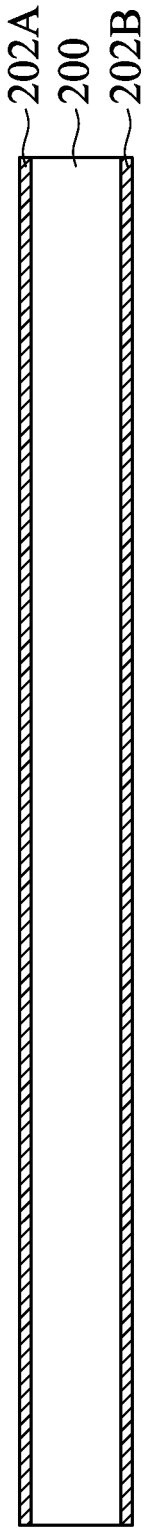
FIGS. 2A-2E are cross-sectional views of various stages of a process for forming a chip package, in accordance with some embodiments.

As shown in FIG. 2A, conductive films 202A and 202B are formed over opposite surfaces of the board 200, in accordance with some embodiments. The conductive films 202A and 202B may be used to assist in a subsequent electroplating process. The board 200 may be made of or include a polymer material, a ceramic material, a metal material, a semiconductor material, one or more other suitable materials, or a combination thereof. For example, the board 200 includes resin, prepreg, glass, and/or ceramic.

The conductive films 202A and 202B may be made of or include aluminum, copper, cobalt, gold, titanium, one or more other suitable materials, or a combination thereof. The conductive films 202A and 202B may be formed using a thermal compression process, a PVD process, a CVD process, a lamination process, a printing process, one or more other application processes, or a combination thereof.

However, embodiments of the disclosure are not limited thereto. In some other embodiments, the conductive films 202A and 202B are not formed.

Figure 2B:
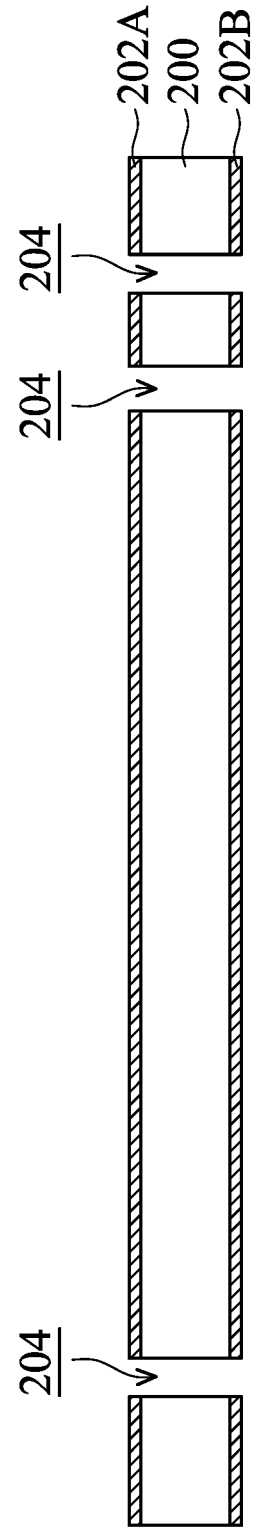

As shown in FIG. 2B, the conductive films 202A and 202B and the board 200 are partially removed to form openings 204, in accordance with some embodiments. In some embodiments, the openings 204 completely penetrate through the board 200 and the conductive films 202A and 202B. The openings 204 may be formed using an energy beam drilling process, a mechanical drilling process, photolithography and etching processes, one or more other applicable processes, or a combination thereof. The energy beam drilling process may include a laser drilling process, an ion beam drilling process, an electron beam drilling process, a plasma beam drilling process, one or more other applicable processes, or a combination thereof.

Afterwards, a seed layer is deposited over the structure shown in FIG. 2B in accordance with some embodiments. The seed layer extends over the conductive films 202A and 202B. The seed layer further extends over sidewalls of the opening 204. Afterwards, patterned photoresist layers are formed on the seed layer. The patterned photoresist layers have openings that partially expose the seed layer and define patterns of conductive features to be formed on the board 200 later. Then, one or more conductive materials are electroplated on the portions of the seed layer not covered by the patterned photoresist layers. Afterwards, the patterned photoresist layers are removed. One or more etching processes are used to remove the portions of the seed layer originally covered by the patterned photoresist layers. The portions of the conductive films 202A and 202B originally covered by the patterned photoresist layers are also removed during the one or more etching processes.

Figure 2C:
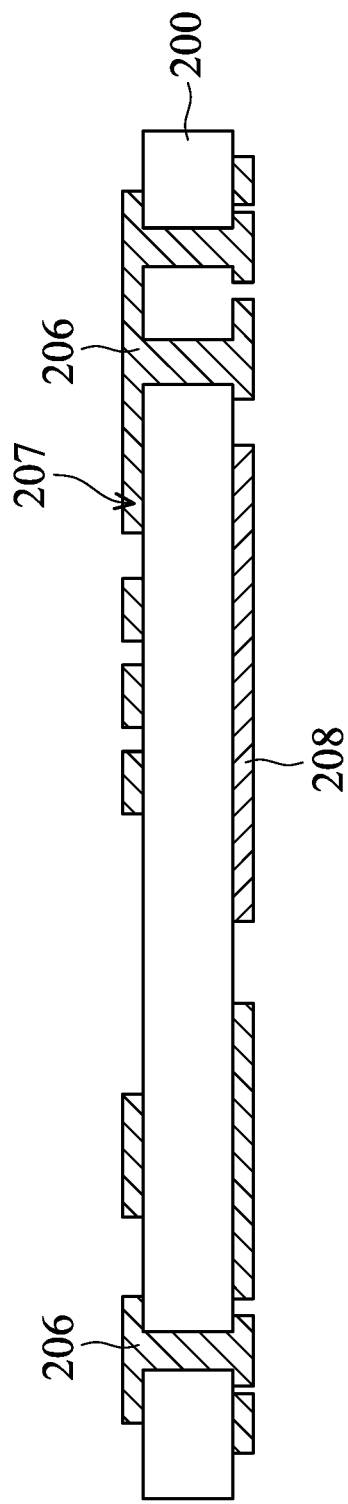

As a result, the board 200 is partially exposed, as shown in FIG. 2C, in accordance with some embodiments. The remaining portions of the electroplated conductive material, the remaining seed layer, and the remaining conductive films 202A and 202B together form conductive features 206 with desired patterns. Some of the conductive features 206 penetrate through the board 200 to provide electrical connections between elements to be positioned on the opposite surfaces of the board.

In some embodiments, some of the conductive features 206 together form one (or more) antenna element 207, as shown in FIG. 2C. The pattern of the antenna element 207 may be fine-tuned to provide desired functions. In some embodiments, the antenna element 207 is a patch antenna that is used to receive and/or transmit electromagnetic signals in normal direction. In some other embodiments, the antenna element 207 is an end-fire antenna that is used to receive and/or transmit electromagnetic signals in side direction. In some embodiments, multiple antenna elements with different functions are formed over the board 200.

As shown in FIG. 2C, a shielding element 208 is formed over the bottom surface of the board 200, in accordance with some embodiments. In some embodiments, one or more of the conductive features 206 form the shielding element 208. In these cases, the antenna element 207 and the shielding element 208 are formed from patterning the same conductive material layer. The antenna element 207 and the shielding element 208 are made of the same material. In some other embodiments, the shielding element 208 and the conductive features 206 are formed using different processes. In some embodiments, the shielding element 208 and the antenna element 207 are made of different materials.

Figure 2D:
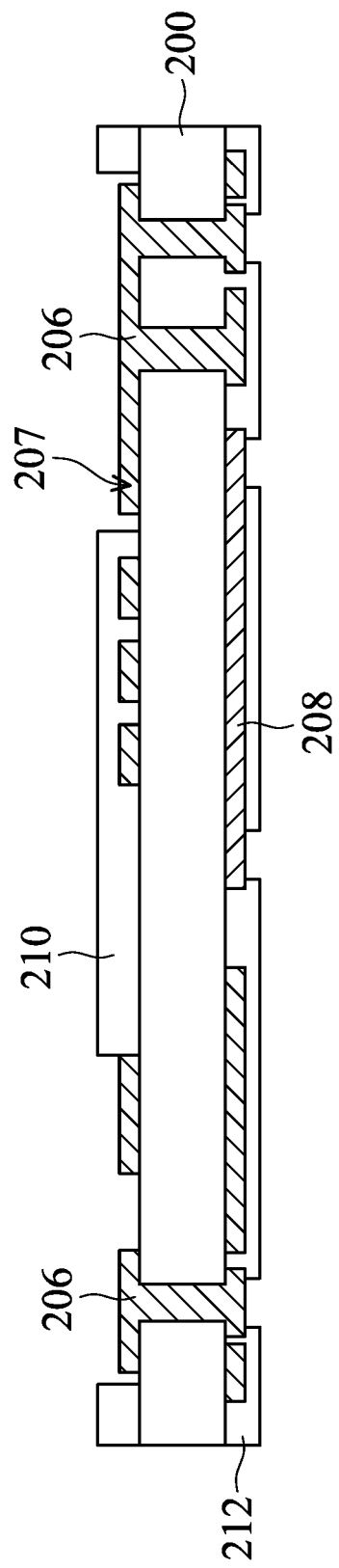

As shown in FIG. 2D, protective layers 210 and 212 are formed over the opposite surfaces of the board 200, in accordance with some embodiments. The protective layers 210 and 212 may be made of or include epoxy-based resin, polyimide, polybenzoxazole, one or more other suitable materials, or a combination thereof. The protective layers 210 and 212 have multiple openings that partially expose the conductive features 206. For example, the antenna element 207 and the shielding element 208 are partially exposed, as shown in FIG. 2D. The formation of the protective layers 210 and 212 may involve a coating process and a photolithography process. The coating process may include a spin coating process, a spray coating process, a lamination process, one or more other applicable processes, or a combination thereof.

Figure 2E:
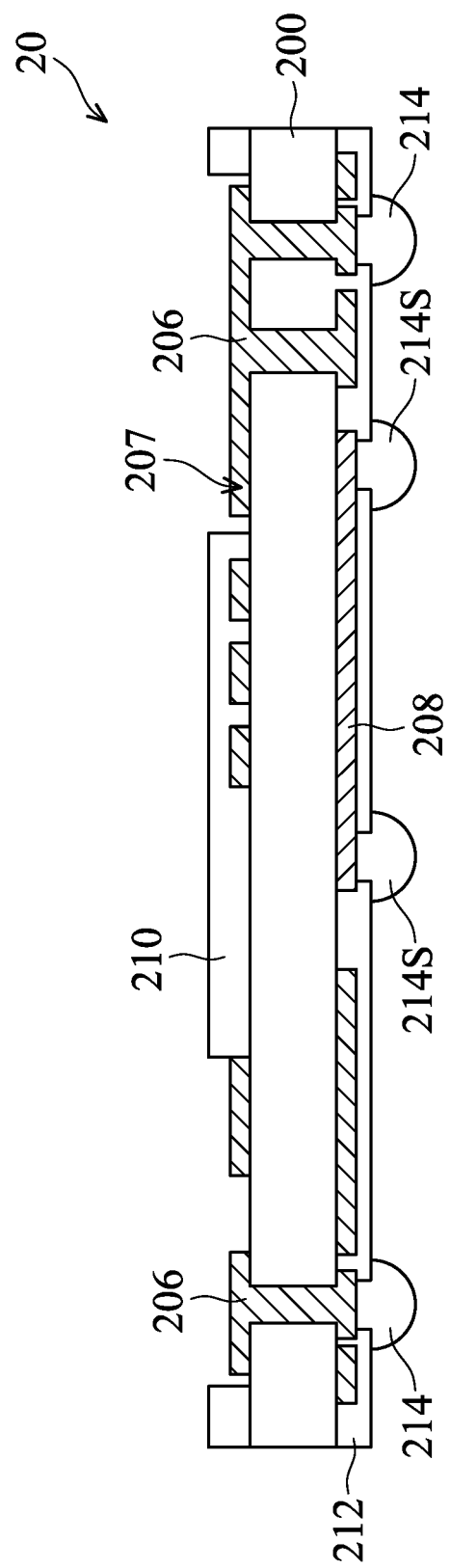

As shown in FIG. 2E, conductive bumps 214 are formed over some of the conductive features 206, in accordance with some embodiments. In some embodiments, conductive bumps 214S are formed over the exposed portions of the shielding element 208, as shown in FIG. 2E. In some embodiments, the conductive bumps 214 and 214S are made of the same material. In some embodiments, the conductive bumps 214 and 214S are tin-containing solder elements. The tin-containing solder elements may further include copper, silver, gold, aluminum, lead, one or more other suitable materials, or a combination thereof. In some embodiments, the tin-containing solder elements are lead free. The formation of the conductive bumps 214 and 214S may involve one or more plating processes (such as electroplating processes) and/or one or more reflow processes. Afterwards, a singulation process may be carried out to saw through the structure. As a result, multiple substrates 20 are formed. In FIG. 2E, one of the substrates 20 is shown.

Referring back to FIG. 1C, the protective substrate 20 is positioned to allow the conductive elements 214 to be substantially aligned with the conductive structures 108, in accordance with some embodiments. The protective substrate 20 is also positioned to allow the conductive elements 214S to be substantially aligned with the conductive structures 108S. As mentioned above, in some embodiments, the conductive elements 214 and 214S are tin-containing solder elements which may facilitate a subsequent bonding process.

Figure 1D:
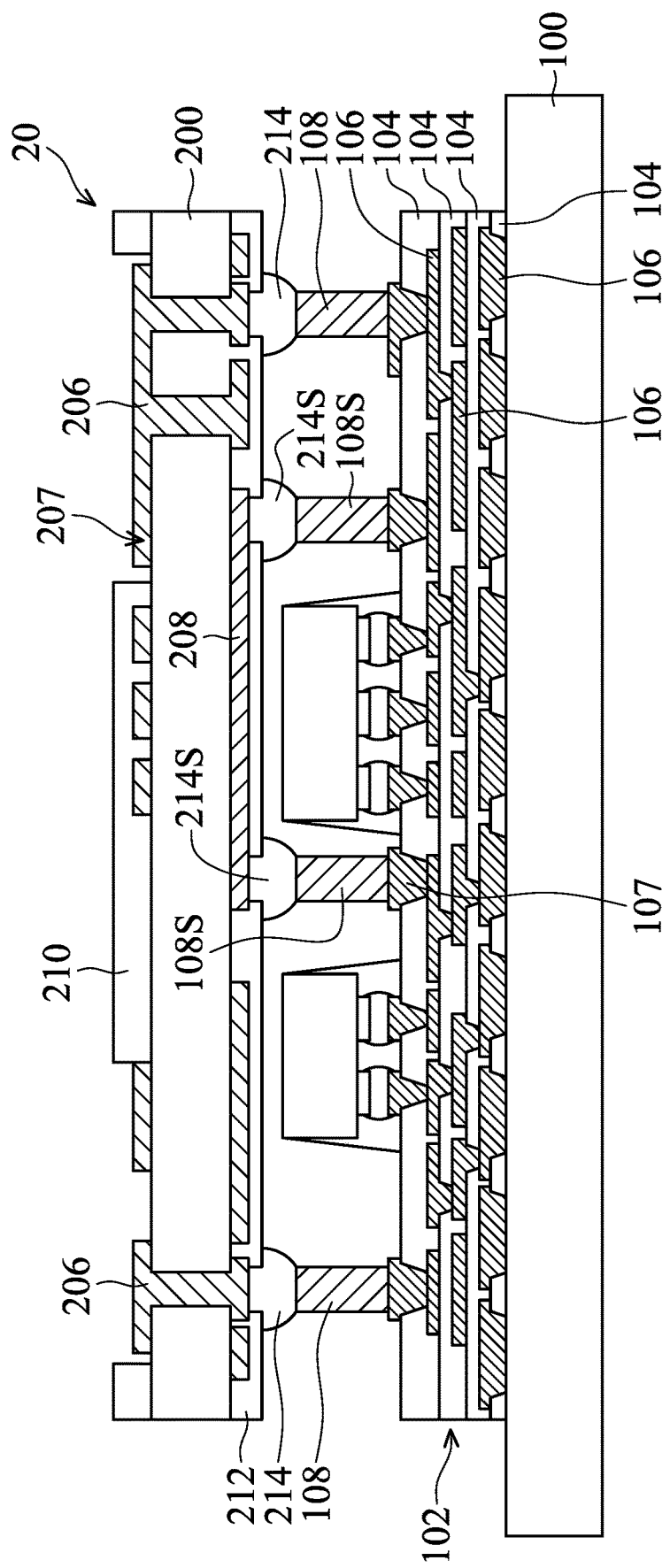

As shown in FIG. 1D, the protective substrate 20 is bonded to the conductive structures 108 and 108S, in accordance with some embodiments. In some embodiments, the protective substrate 20 is bonded to the conductive structures 108 and 108S through the conductive bumps 214 and 214S. As mentioned above, in some embodiments, the conductive bumps 214 and 214S are tin-containing solder elements. A reflow process may be used to bond the conductive bumps 214 and 214S to the conductive structures 108 and 108S, respectively. In some embodiments, after the protective substrate 20 is bonded onto the conductive structures 214 and 214S, the shielding element 208 is also disposed over the semiconductor die 110A. The shielding element 208 is electrically connected to the conductive structures 108S through the conductive bumps 214S.

The conductive structures 108S (which together function as a shielding structure) and the shielding element 208 may be used to prevent the electromagnetic wave generated by the semiconductor die 110A from affecting the operation of nearby device elements, such as the semiconductor die 110B or another nearby package. In some other cases where the conductive structures 108S or the shielding element 208 are not formed, the electromagnetic wave generated by the semiconductor die 110A may negatively affect the operation of the semiconductor die 110B or the operation of another nearby device elements.

Figure 3:
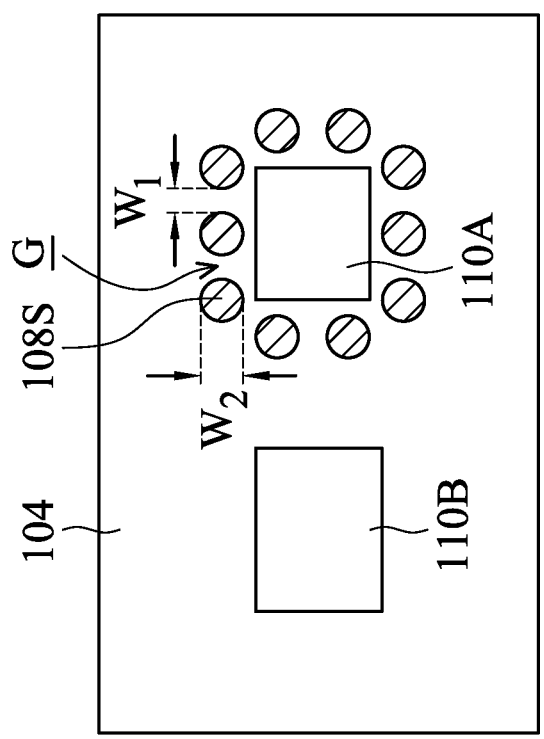
FIG. 3 is a top view of an intermediate stage of a process for forming a chip package, in accordance with some embodiments.

FIG. 3 is a top view of an intermediate stage of a process for forming a chip package, in accordance with some embodiments. In some embodiments, FIG. 3 shows the top view of the structure shown in FIG. 1B. For simplicity and clarity, only the shielding structure, the topmost insulating layer 104, and the semiconductor dies 110A and 110B are illustrated.

As shown in FIG. 3, the conductive structures 108S surround or encircle a space where the semiconductor die 110A is positioned, in accordance with some embodiments. The semiconductor die 110B is disposed outside of an area that is surrounded by the conductive structures 108S. In some embodiments, the top view of each of the conductive structures 108S has a circular profile. The conductive structures 108S together form a shielding structure. The shielding structure has multiple openings G that expose the space containing the semiconductor die 110A. Therefore, during a subsequent formation process of a protective layer, a portion of the protective layer could penetrate through the openings G to surround and protect the semiconductor die 110A.

In some embodiments, two nearby conductive structures 108S are separated from each other by a distance $W_1$, as shown in FIG. 3. The distance $W_1$ may be in a range from about 10 μm to half the wavelength of the electromagnetic wave generated by the semiconductor die 110A. Each of the conductive structures 108S has a width $W_2$, as shown in FIG. 3. In some embodiments, the width $W_2$ is in a range from about 5 μm to about ten times the distance $W_1$ to ensure sufficient shielding efficiency.

In some cases, if the distance $W_1$ is smaller than about 10 μm, the subsequently formed protective layer might not be able to penetrate through the openings to protect the semiconductor die 110A. Alternatively, the subsequently formed protective layer might not be able to completely surround and protect the semiconductor die 110A. The reliability and quality of the chip package may be negatively affected.

In some other cases, if the distance $W_1$ is greater than half the wavelength of the electromagnetic wave generated by the semiconductor die 110A, the shielding efficiency may not be sufficient. As a result, the electromagnetic wave generated by the semiconductor die 110A during operation may not be well shielded and may reach the nearby device elements (such as the semiconductor die 110B or another nearby package) to negatively affect the operation.

For example, the operation frequency of the semiconductor die 110A may be about 28 GHz. In these cases, electromagnetic wave having a wavelength of about 10.7 mm may be generated by the semiconductor die 110A during operation. In these cases, half the wavelength of the electromagnetic wave generated by the semiconductor die 110A is about 5.35 mm. In some embodiments, the distance $W_1$ is designed to be in a range from about 10 μm to about 5.35 mm to ensure sufficient shielding efficiency and to ensure sufficient protection of the semiconductor die 110A. In some embodiments, the width $W_2$ is designed to be in a range from about 5 μm to about 53.5 mm.

However, embodiments of the disclosure are not limited thereto. Many variations and/or modifications can be made to embodiments of the disclosure. The top views of different conductive structures may have different shapes.

Figure 4:
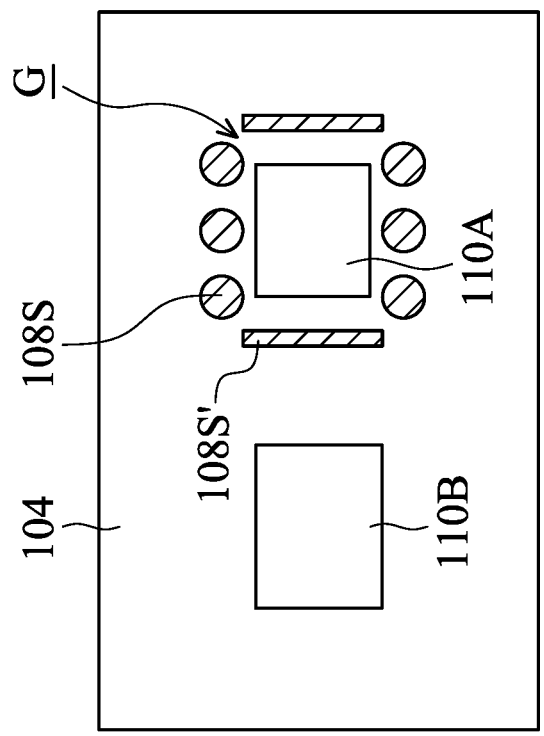
FIG. 4 is a top view of an intermediate stage of a process for forming a chip package, in accordance with some embodiments.

FIG. 4 is a top view of an intermediate stage of a process for forming a chip package, in accordance with some embodiments. In some embodiments, FIG. 4 shows the top view of the structure shown in FIG. 1B. For simplicity and clarity, only the shielding structure, the topmost insulating layer 104, and the semiconductor dies 110A and 110B are illustrated.

As shown in FIG. 4, the semiconductor die 110A is surrounded by not only the conductive structures 108S but also the conductive walls 108S', in accordance with some embodiments. In some embodiments, a lateral extending direction of the conductive walls 108S' is substantially parallel to a lateral extending direction of the side of the semiconductor die 110A. The conductive structures 108S and the conductive walls 108S' together function as a shielding structure.

The shielding structure has multiple openings G that expose the space containing the semiconductor die 110A. Therefore, during a subsequent formation process of a protective layer, a portion of the protective layer could penetrate through the openings G to surround and protect the semiconductor die 110A. In some embodiments, the distance between any nearby conductive structures 108S and/or conductive walls 108S' is in a range from about 10 μm to half the wavelength of the electromagnetic wave generated by the semiconductor die 110A.

Figure 5:
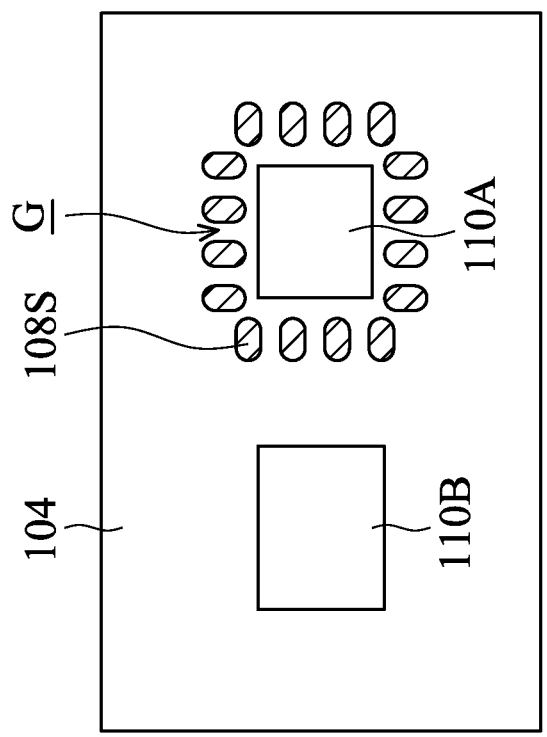
FIG. 5 is a top view of an intermediate stage of a process for forming a chip package, in accordance with some embodiments.

Many variations and/or modifications can be made to embodiments of the disclosure. FIG. 5 is a top view of an intermediate stage of a process for forming a chip package, in accordance with some embodiments. In some embodiments, FIG. 5 shows the top view of the structure shown in FIG. 1B. For simplicity and clarity, only the shielding structure, the topmost insulating layer 104, and the semiconductor dies 110A and 110B are illustrated.

In some embodiments, the top view of each of the conductive structures 108S has an oval profile, as shown in FIG. 5. The conductive structures 108S together form a shielding structure. The shielding structure has multiple openings G that expose the space containing the semiconductor die 110A. Therefore, during a subsequent formation process of a protective layer, a portion of the protective layer could penetrate through the openings G to surround and protect the semiconductor die 110A. In some embodiments, the distance between any nearby conductive structures 108S and/or conductive walls 108S' is in a range from about 10 μm to half the wavelength of the electromagnetic wave generated by the semiconductor die 110A.

Figure 6:
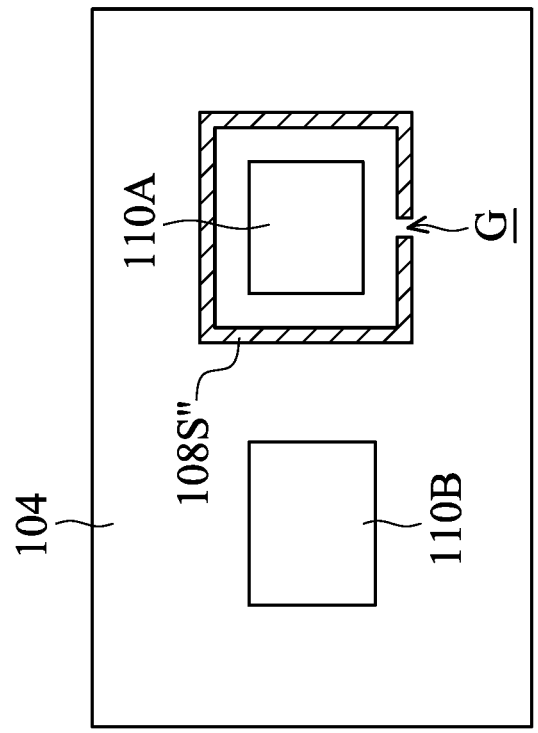
FIG. 6 is a top view of an intermediate stage of a process for forming a chip package, in accordance with some embodiments.

Many variations and/or modifications can be made to embodiments of the disclosure. FIG. 6 is a top view of an intermediate stage of a process for forming a chip package, in accordance with some embodiments. In some embodiments, FIG. 6 shows the top view of the structure shown in FIG. 1B. For simplicity and clarity, only the shielding structure, the topmost insulating layer 104, and the semiconductor dies 110A and 110B are illustrated.

In some embodiments, the semiconductor die 110A is surrounded by a single conductive wall 108S" that functions as a shielding structure. The shielding structure has an openings G that expose the space containing the semiconductor die 110A. Therefore, during a subsequent formation process of a protective layer, a portion of the protective layer could penetrate through the openings G to surround and protect the semiconductor die 110A. In some embodiments, the width of the opening G is in a range from about 10 μm to half the wavelength of the electromagnetic wave generated by the semiconductor die 110A.

Figure 7:
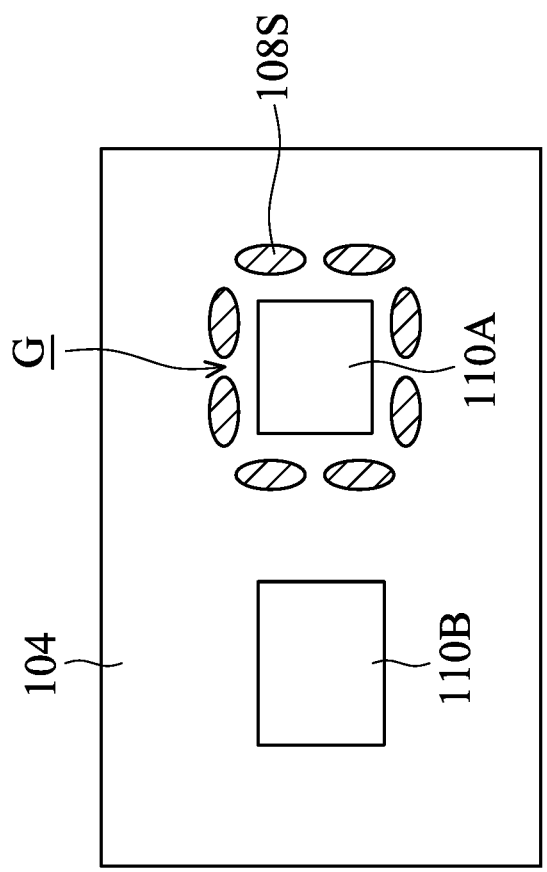
FIG. 7 is a top view of an intermediate stage of a process for forming a chip package, in accordance with some embodiments.

Many variations and/or modifications can be made to embodiments of the disclosure. FIG. 7 is a top view of an intermediate stage of a process for forming a chip package, in accordance with some embodiments. In some embodiments, FIG. 7 shows the top view of the structure shown in FIG. 1B. For simplicity and clarity, only the shielding structure, the topmost insulating layer 104, and the semiconductor dies 110A and 110B are illustrated.

In some embodiments, the top view of each of the conductive structures 108S has an oval profile, as shown in FIG. 7. In some embodiments, the long axis of one or each of the conductive structures 108S extends along a direction that is substantially parallel to the extending direction of the corresponding side of the semiconductor die 110A, as shown in FIG. 7.

The conductive structures 108S together form a shielding structure. The shielding structure has multiple openings G that expose the space containing the semiconductor die 110A. Therefore, during a subsequent formation process of a protective layer, a portion of the protective layer could penetrate through the openings G to surround and protect the semiconductor die 110A. In some embodiments, a distance between any nearby conductive structures 108S and/or conductive walls 108S' is in a range from about 10 μm to half the wavelength of the electromagnetic wave generated by the semiconductor die 110A.

In some embodiments, as mentioned above, the shielding structure and the shielding element 208 are electrically connected to each other. Therefore, the shielding structure (including the conductive structures 108S and/or the conductive walls 108S') and the shielding element 208 may together reduce or prevent the electromagnetic interference (EMI) effect caused by the semiconductor die 110A. Many variations and/or modifications can be made to the shielding element 208, in accordance with some embodiments. For example, the top view of the shielding element 208 has many variations.

Figure 14:
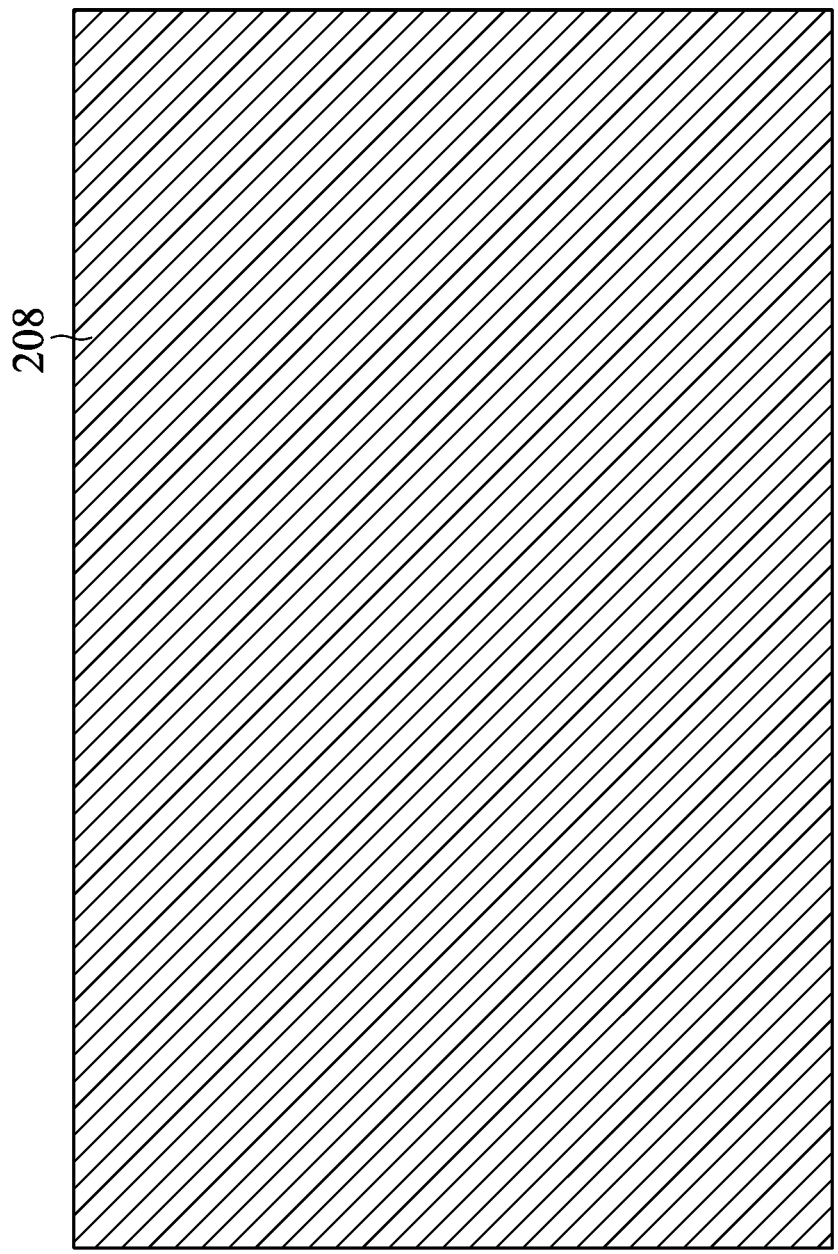
FIG. 14 is a top view of a shielding element of a chip package, in accordance with some embodiments.

FIG. 14 is a top view of a shielding element of a chip package, in accordance with some embodiments. In some embodiments, FIG. 14 shows the top view of the shielding element 208 shown in FIG. 1D. In some embodiments, the shielding element 208 is a conductive plate. In some embodiments, the conductive plate has no opening or through-hole. In some embodiments, the shielding element 208 covers the shielding structure (including the conductive structures 108S and/or the conductive walls 108S') and the semiconductor die 110A.

Figure 15:
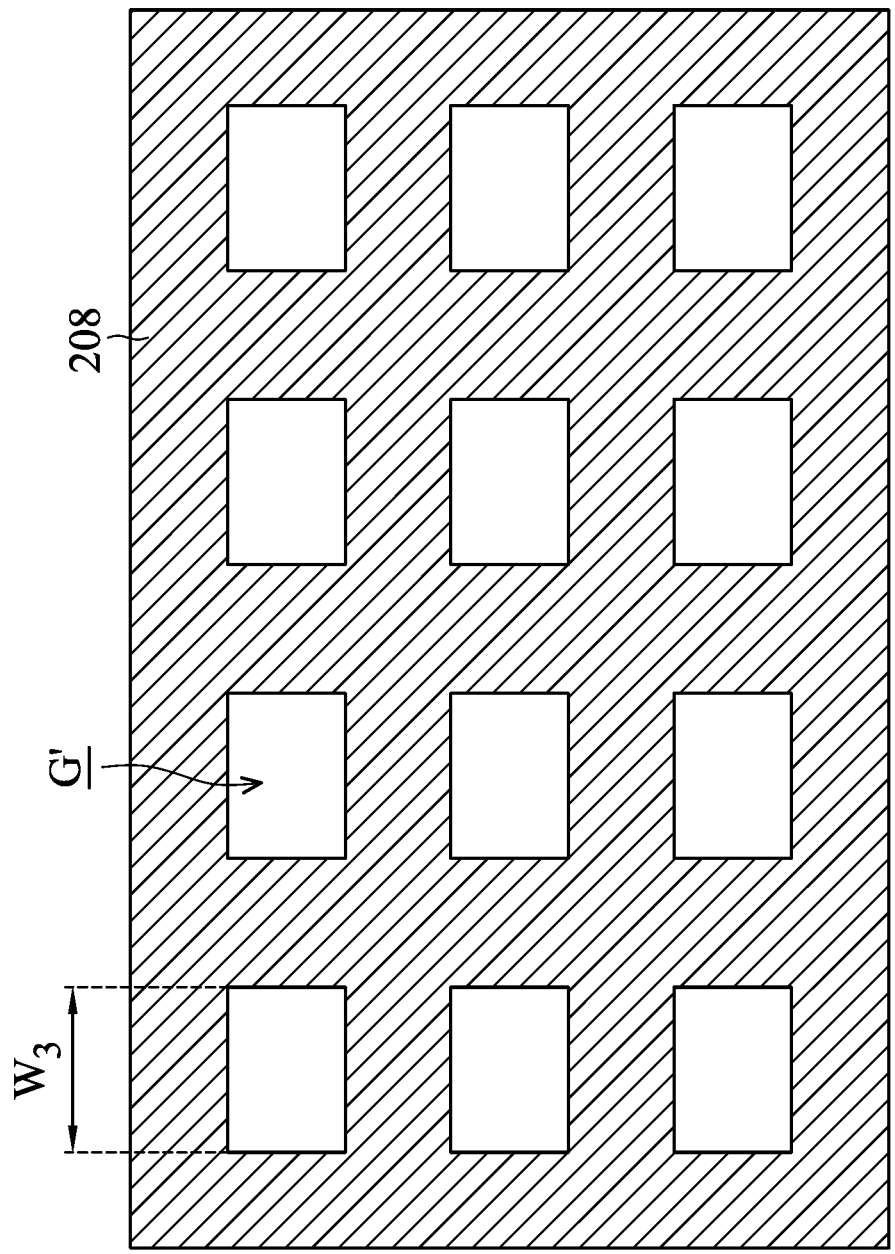
FIG. 15 is a top view of a shielding element of a chip package, in accordance with some embodiments.

Many variations and/or modifications can be made to embodiments of the disclosure. FIG. 15 is a top view of a shielding element of a chip package, in accordance with some embodiments. In some embodiments, the shielding element 208 is a conductive mesh with many through-holes G'. In some embodiments, each of the through-holes G' is designed to have a width $W_3$ that is in a range from about 10 μm to half the wavelength of the electromagnetic wave generated by the semiconductor die 110A. Therefore, the shielding efficiency of the shielding element 208 is ensured.

In some other embodiments, the shielding element 208 includes a combination of a conductive plate and a conductive mesh. For example, a portion of the shielding element 208 is a conductive plate without through-holes G', and another portion of the shielding element 208 is a conductive mesh with through-holes G'.

Figure 1E:
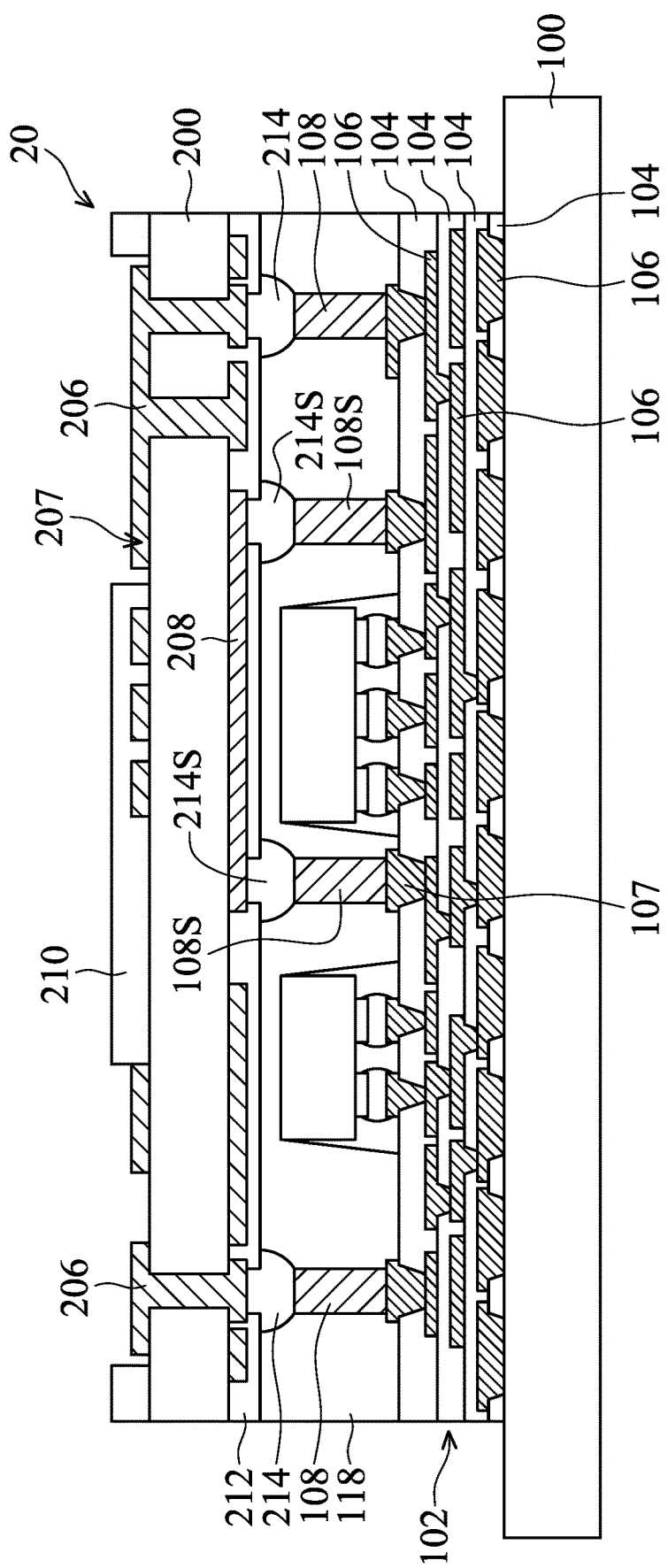

Referring to FIG. 1E, a protective layer 118 is formed to surround the semiconductor dies 110A and 110B and the conductive structures 108S and 108, in accordance with some embodiments. In some embodiments, the protective layer 118 penetrates through the openings G (as shown in FIG. 3, 4, 5, 6, or 7) between the conductive structures 108S to surround the semiconductor die 110A. In some embodiments, the protective layer 118 is in direct contact with the conductive structures 108 and 108S. In some embodiments, the protective layer 118 is in direct contact with the semiconductor dies 110A and 110B. In some embodiments, a portion of the protective layer 118 is between the semiconductor die 110A and the shielding element 208.

In some embodiments, the material of the protective layer 118 is different from that of the board 200. In some embodiments, the protective layer 118 has a greater dielectric constant than that of the board 200. In some embodiments, the protective layer 118 has a greater dissipation factor than that of the board 200.

In some embodiments, the protective layer 118 is made of or includes a molding compound material. The molding compound material may include a polymer material, such as an epoxy-based resin with fillers dispersed therein. In some embodiments, a liquid molding compound material is introduced or injected between the protective substrate 20 and the carrier substrate 100. The liquid molding compound material may flow into the openings G to encapsulate the semiconductor die 110A. A thermal process is then used to cure the liquid molding compound material and to transform it into the protective layer 118.

Figure 1F:
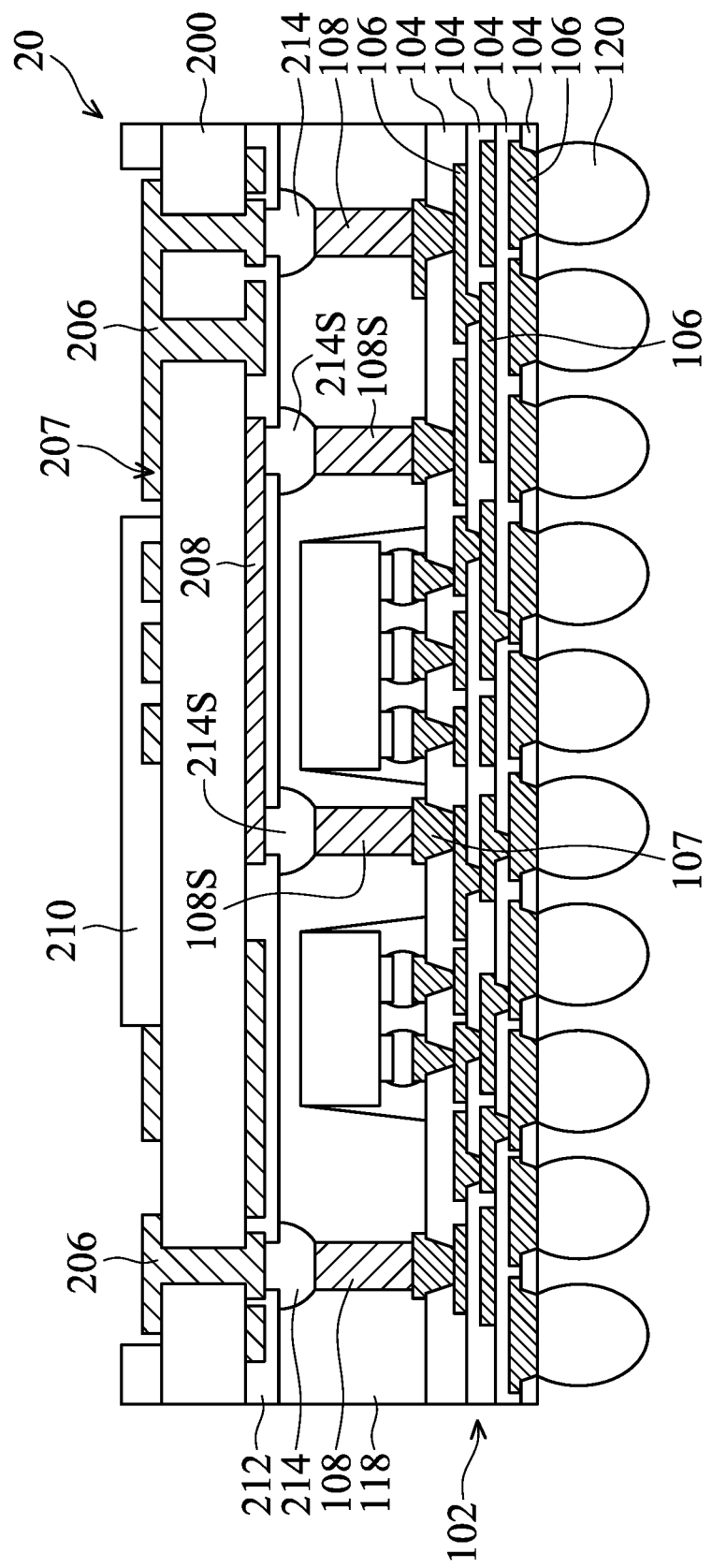

As shown in FIG. 1F, the carrier substrate 100 is removed, and conductive bumps 120 are formed, in accordance with some embodiments. In some embodiments, the conductive bumps 120 are or include solder bumps such as tin-containing solder bumps. The tin-containing solder bumps may further include copper, silver, gold, aluminum, lead, one or more other suitable materials, or a combination thereof. In some embodiments, the tin-containing solder bump is lead free. In some embodiments, solder balls (or solder elements) are disposed onto the exposed conductive features 106 after the removal of the carrier substrate 100. A reflow process is then carrier out to melt the solder balls into the conductive bumps 120. In some other embodiments, under bump metallization (UBM) elements are formed over the exposed conductive features 106 before the solder balls are disposed. In some other embodiments, solder elements are electroplated onto the exposed conductive features 106. Afterwards, a reflow process is used to melt the solder element to form the conductive bumps 120. In some embodiments, a singulation process is then carrier out to saw through the formed structure. As a result, multiple separate chip packages are formed. In FIG. 1F, one of the chip packages is shown.

Figure 8A:
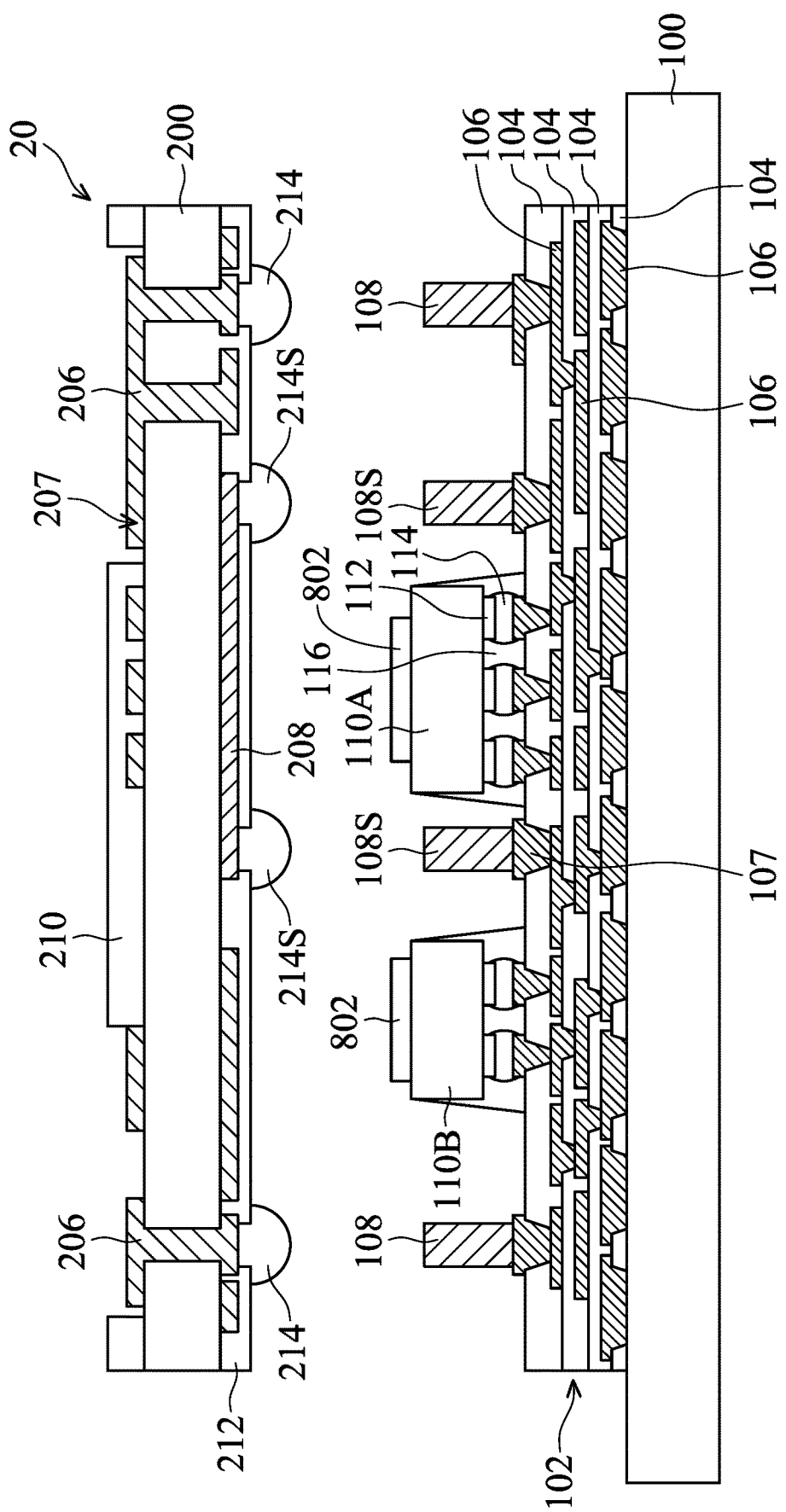
FIGS. 8A-8C are cross-sectional views of various stages of a process for forming a chip package, in accordance with some embodiments.
Figure 8B:
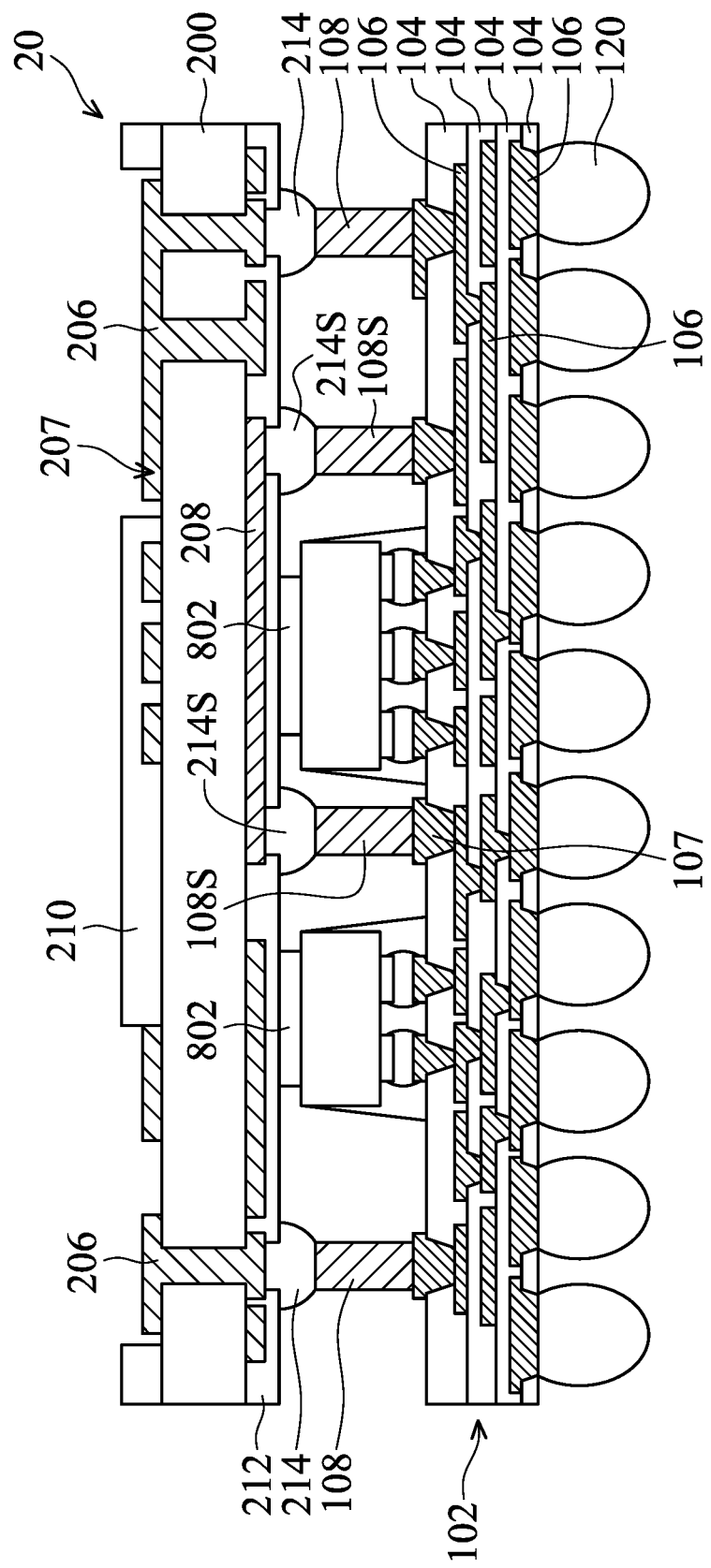
Figure 8C:
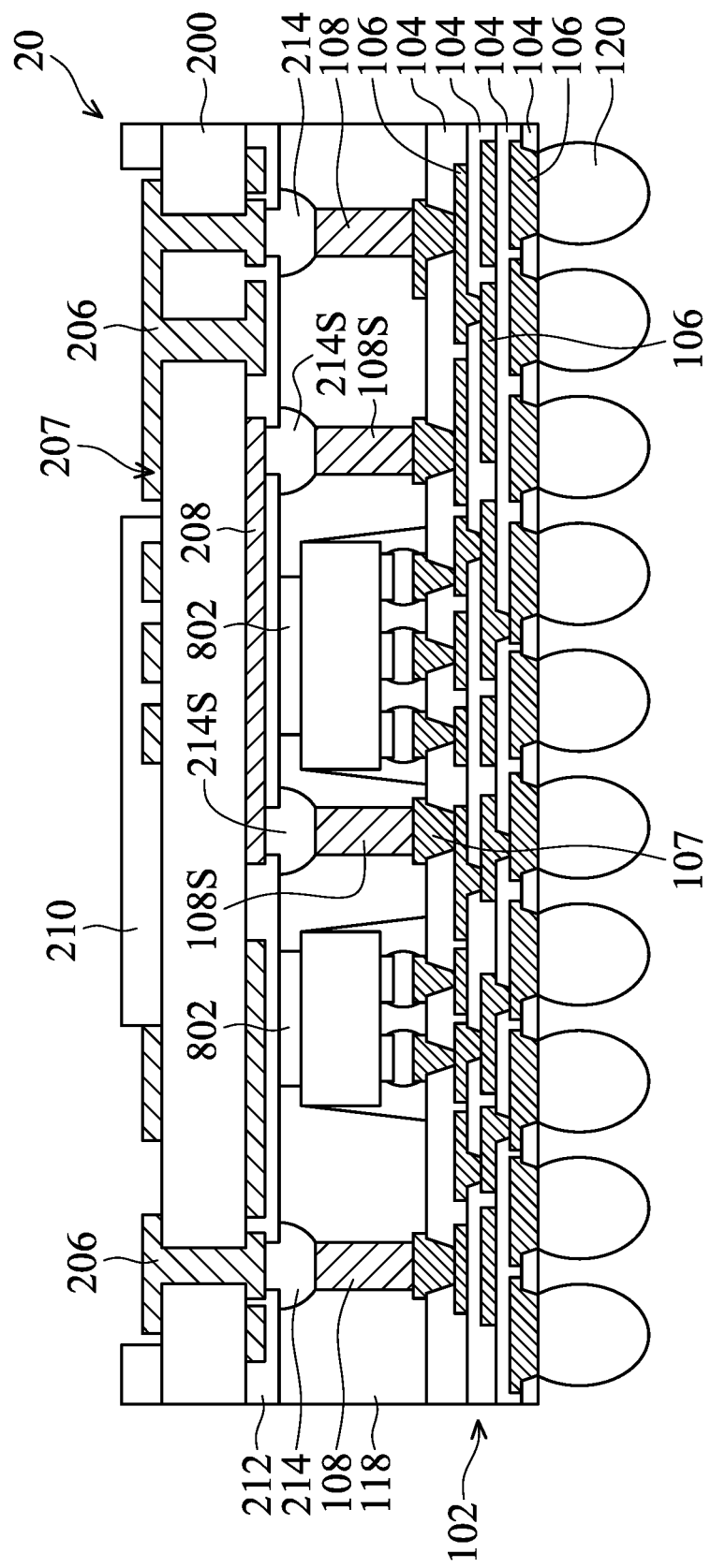

Many variations and/or modifications can be made to embodiments of the disclosure. FIGS. 8A-8C are cross-sectional views of various stages of a process for forming a chip package, in accordance with some embodiments. As shown in FIG. 8A, a structure similar to the structure shown in FIG. 1C is provided or formed, in accordance with some embodiments.

In some embodiments, adhesive elements 802 are formed over the semiconductor dies 110A and 110B before the protective substrate 20 is bonded to the conductive structures 108 and 108S, as shown in FIG. 8A. The adhesive elements 802 may include adhesive tapes, adhesive glue, or other suitable elements.

As shown in FIG. 8B, the protective substrate 20 is bonded to the conductive structures 108 and 108S, in accordance with some embodiments. In some embodiments, the protective substrate 20 is bonded to the conductive structures 108 and 108S through the conductive bumps 214 and 214S. The adhesive elements 802 may assist in the bonding process to prevent misalignment and/or undesired displacement.

Afterwards, the processes the same as or similar to those illustrated in FIGS. 1E and 1F are used to form a chip package, as shown in FIG. 8C in accordance with some embodiments.

Figure 9:
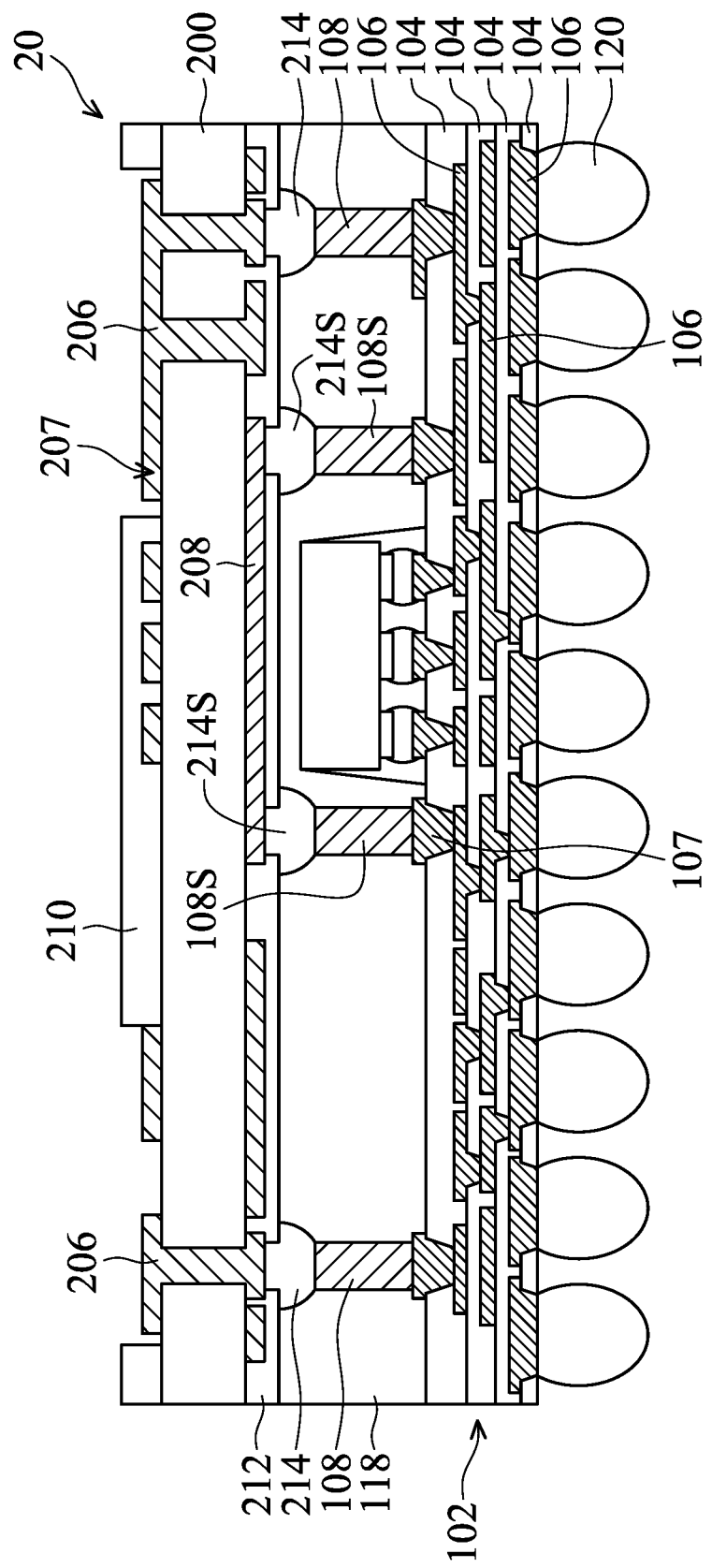
FIG. 9 is a cross-sectional view of a chip package, in accordance with some embodiments.

Many variations and/or modifications can be made to embodiments of the disclosure. FIG. 9 is a cross-sectional view of a chip package, in accordance with some embodiments. In some embodiments, the chip package includes a single semiconductor die (the semiconductor die 110A) that is surrounded by the conductive structures 108S and the shielding element 208.

Figure 10:
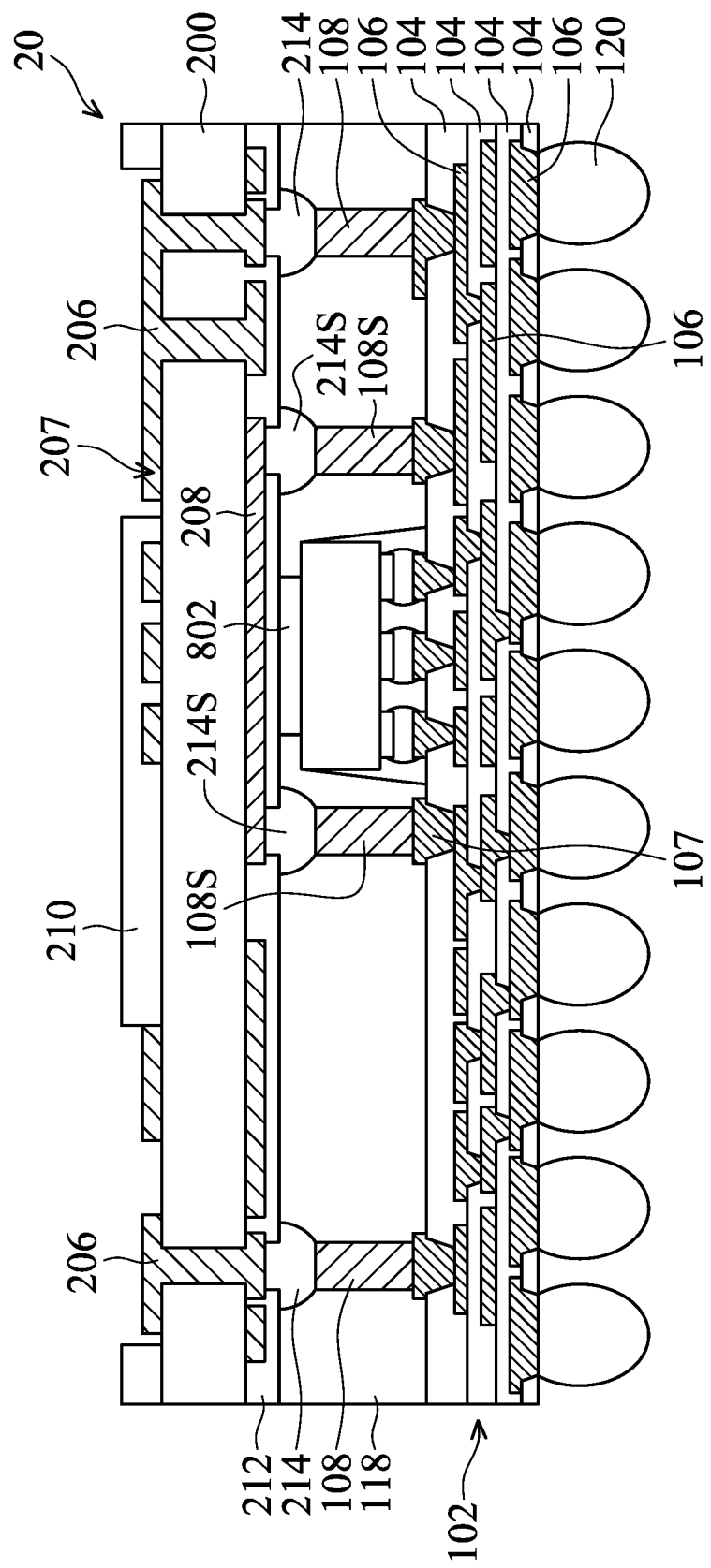
FIG. 10 is a cross-sectional view of a chip package, in accordance with some embodiments.

Many variations and/or modifications can be made to embodiments of the disclosure. FIG. 10 is a cross-sectional view of a chip package, in accordance with some embodiments. In some embodiments, the chip package includes a single semiconductor die (the semiconductor die 110A) that is surrounded by the conductive structures 108S and the shielding element 208. As shown in FIG. 10, the adhesive element 802 is formed between the semiconductor die 110A and the shielding element 208.

Figure 11:
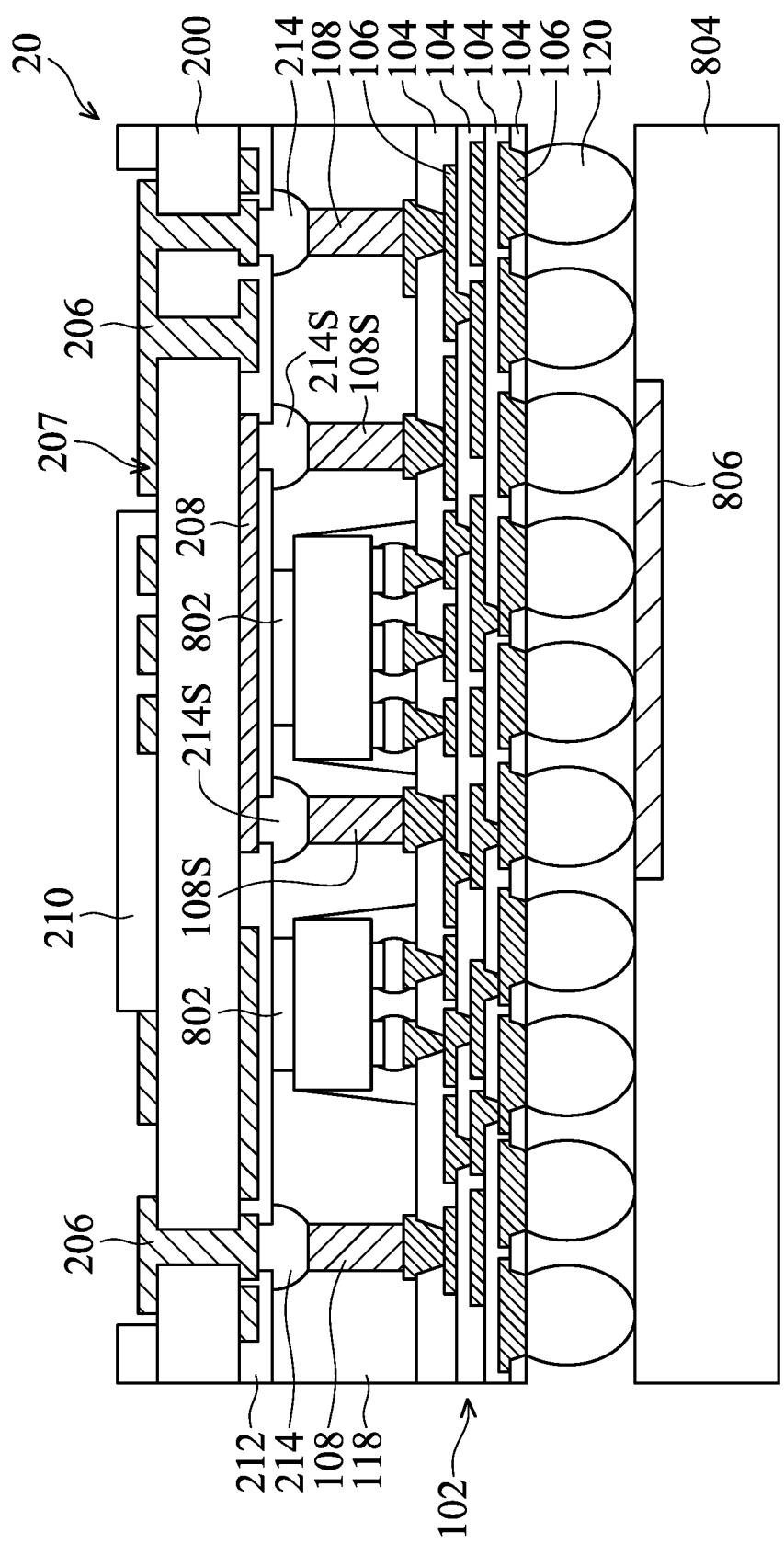
FIG. 11 is a cross-sectional view of a chip package, in accordance with some embodiments.

Many variations and/or modifications can be made to embodiments of the disclosure. FIG. 11 is a cross-sectional view of a chip package, in accordance with some embodiments. In some embodiments, a structure the same as or similar to the structure shown in FIG. 8C is provided or formed. Afterwards, the structure is bonded onto a circuit board 804. In some embodiments, the circuit board 804 is a printed circuit board. In some embodiments, the circuit board 804 includes a shielding element 806.

Similar to the shielding element 208, the shielding element 806 may be a conductive plate, a conductive mesh, or a combination thereof. The shielding element 806 may be used to further enhance shielding efficiency. The conductive structures 108S (which together function as a shielding structure), the shielding element 208, and the shielding element may together be used to prevent the electromagnetic wave generated by the semiconductor die 110A from affecting the operation of nearby device elements, such as the semiconductor die 110B or another nearby package In some embodiments, the shielding element 208 is formed between the board 200 and the semiconductor die 110A. However, embodiments of the disclosure are not limited thereto. Many variations and/or modifications can be made to embodiments of the disclosure. In some other embodiments, the shielding element is formed at another position.

Figure 12:
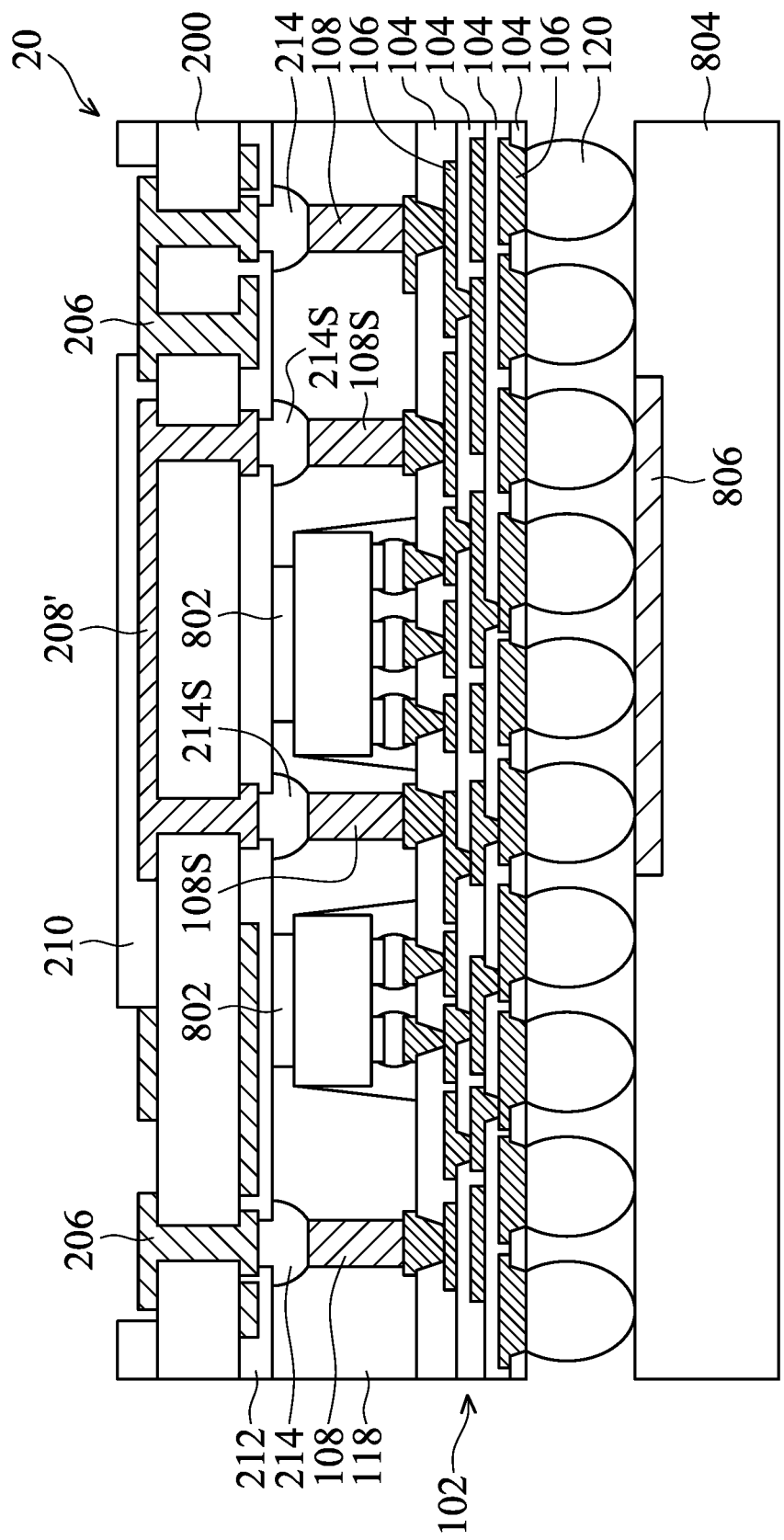
FIG. 12 is a cross-sectional view of a chip package, in accordance with some embodiments.

FIG. 12 is a cross-sectional view of a chip package, in accordance with some embodiments. In some embodiments, a shielding element 208' is formed. The shielding element 208' has a first portion positioned above the board 200 and a second portion penetrating through the board 200. Therefore, in these cases, the board 200 is positioned between the first portion of the shielding element 208' and the semiconductor die 110A. The first portion of the shielding element 208' is electrically connected to the conductive structures 108S through conductive element 214S and the second portion of the shielding element 208'. The material and formation method of the shielding element 208' may be the same as or similar to those of the shielding element 208 and/or the conductive feature 206. Similar to the shielding element 208, the shielding element 806 may be a conductive plate, a conductive mesh, or a combination thereof.

Figure 13:
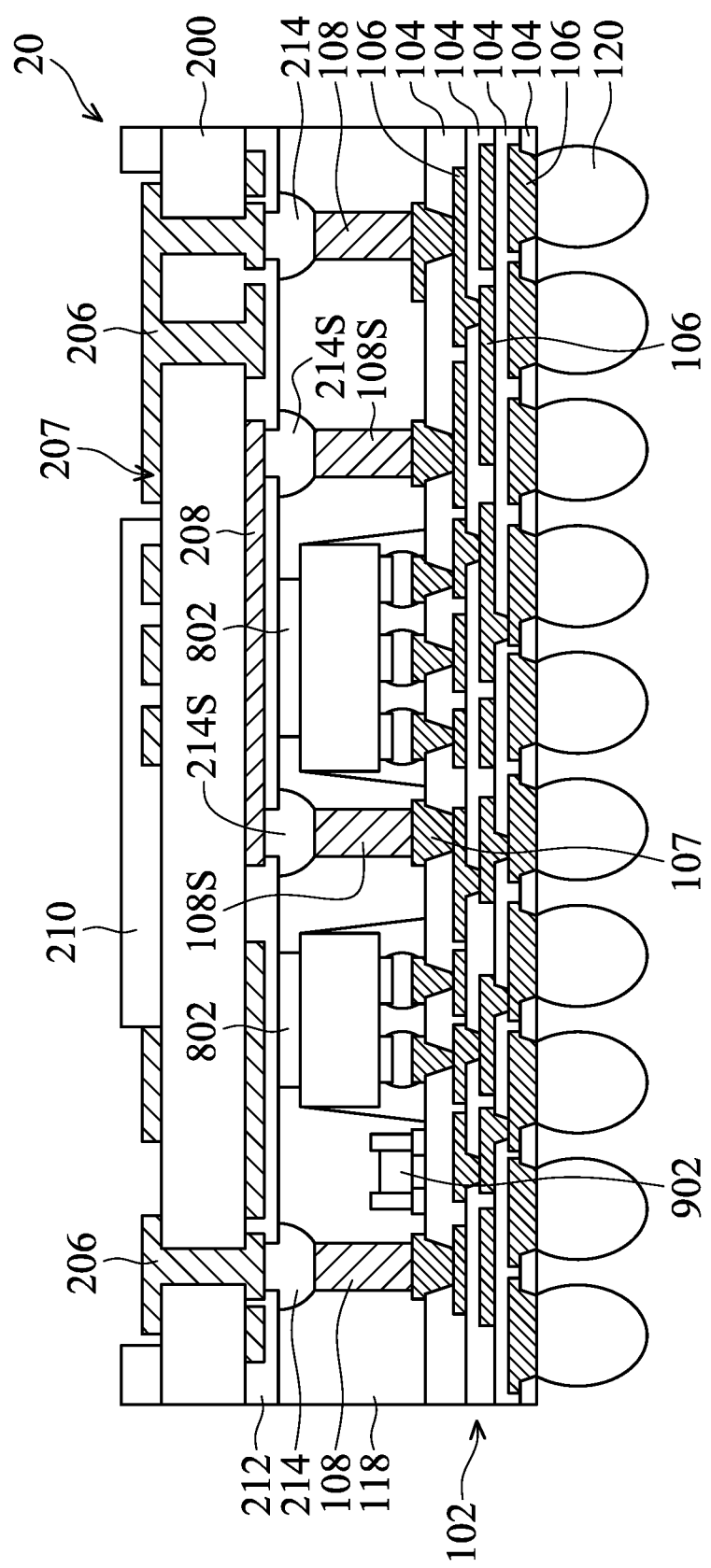
FIG. 13 is a cross-sectional view of a chip package, in accordance with some embodiments.

Many variations and/or modifications can be made to embodiments of the disclosure. FIG. 13 is a cross-sectional view of a chip package, in accordance with some embodiments. FIG. 13 shows a cross-sectional view of a chip package that is similar to that shown in FIG. 11. In some embodiments, the chip package further includes one (or more) passive component 902. The passive component 902 may include a resistor, a capacitor, an inductor, one or more other suitable elements, or a combination thereof.

Many variations and/or modification can be made to embodiments of the disclosure. For example, the position and/or the number of the antenna element may be modified. In some embodiments, some of the conductive features 106 together function as an antenna element. In some embodiments, some of the conductive structures 108 function as an antenna element. In some embodiments, multiple antenna elements are formed.

Embodiments of the disclosure form a chip package with a shielding structure. One or more conductive structures are formed to surround an area where a semiconductor die is designed to be positioned. The semiconductor die may include radio-frequency circuits and would generate electromagnetic wave during operation. The conductive structures surround the semiconductor die and function as the shielding structure. Therefore, the generated electromagnetic wave may be prevented from negatively affecting the operation of nearby device elements. The quality and performance of the chip package are significantly improved.

In accordance with some embodiments, a method for forming a chip package is provided. The method includes forming multiple conductive structures over a carrier substrate. The method also includes disposing a semiconductor die over the carrier substrate such that the conductive structures surround the semiconductor die. In addition, the method includes disposing a shielding element over the semiconductor die and the conductive structures. The shielding element is electrically connected to the conductive structures.

In accordance with some embodiments, a method for forming a chip package is provided. The method includes forming a shielding structure over a carrier substrate. The method also includes disposing a semiconductor die over the carrier substrate such that the shielding structure surrounds the semiconductor die. The shielding structure has one or more openings exposing a space containing the semiconductor die. The method further includes forming a protective layer over the carrier substrate such that a portion of the protective layer penetrates through the one or more openings to surround the semiconductor die. In addition, the method includes disposing a shielding element over the semiconductor die and the shielding structure. The shielding element is electrically connected to the shielding structure.

In accordance with some embodiments, a chip package is provided. The chip package includes a redistribution structure and a semiconductor die over the redistribution structure. The chip package also includes a shielding element over the semiconductor die and multiple conductive structures over the redistribution structure. The conductive structures surround the semiconductor die and electrically connected to the shielding element.

In accordance with some embodiments, a chip package is provided. The chip package includes a redistribution structure and first semiconductor die and a second semiconductor die over the redistribution structure. The chip package also includes a shielding element over the first semiconductor die. The chip package further includes conductive structures over the redistribution structure. The conductive structures surround an area where the first semiconductor die is positioned. The second semiconductor die is positioned outside of the area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package, comprising:
a redistribution structure;
a first semiconductor die and a second semiconductor die over the redistribution structure;
a board disposed above the redistribution structure;
a shielding element over the first semiconductor die, wherein the shielding element has a first portion positioned on the board and a second portion penetrating through the board, the first portion of the shielding element at least partially overlaps the first semiconductor die but does not overlap the second semiconductor die in a top view, and a bottom surface of the second portion of the shielding element is lower than a bottom surface of the board; and
a plurality of conductive structures over the redistribution structure, wherein the conductive structures surround an area where the first semiconductor die is positioned, and the second semiconductor die is positioned outside of the area;
wherein two of the conductive structures are separated from each other by a distance, and the distance is smaller than half a wavelength of an electromagnetic wave generated by the first semiconductor die.

2. The chip package as claimed in claim 1, wherein the shielding element comprises a conductive mesh having a plurality of through-holes, and each of the through-holes has a width that is smaller than half the wavelength of the electromagnetic wave generated by the first semiconductor die.

3. The chip package as claimed in claim 1, wherein the conductive structures are electrically connected to the shielding element through tin-containing solder elements.

4. The chip package as claimed in claim 1, further comprising a protective layer surrounding the first semiconductor die and the second semiconductor die, wherein the protective layer is in direct contact with the conductive structures.

5. The chip package as claimed in claim 1, wherein the shielding element comprises a combination of a conductive plate without through-holes and a conductive mesh with a plurality of through-holes.

6. A chip package, comprising:
   a redistribution structure;
   a semiconductor die over the redistribution structure;
   a shielding element over the semiconductor die;
   a plurality of conductive structures over the redistribution structure and electrically connected to the shielding element; and
   a plurality of conductive walls over the redistribution structure and electrically connected to the shielding element, wherein each of the conductive walls is continuous;
   wherein in a top view, the semiconductor die comprises four sides, the conductive walls are arranged on two opposite sides of the semiconductor die, and the conductive structures are arranged on the other two opposite sides of the semiconductor die and not arranged on the two opposite sides on which the conductive walls are arranged;
   wherein there is only one of the conductive walls located on each of the two opposite sides of the semiconductor die;
   wherein there are more than one of the conductive structures located on each of the other two opposite sides of the semiconductor die.

7. The chip package as claimed in claim 6, wherein two of the conductive structures are separated from each other by a distance, and the distance is in a range from about 10 μm to half a wavelength of an electromagnetic wave generated by the semiconductor die.

8. The chip package as claimed in claim 7, wherein one of the conductive structures has a width, and the width is in a range from about 5 μm to about ten times the distance.

9. The chip package as claimed in claim 6, further comprising:
   a board above the redistribution structure; and
   a second shielding element formed in the board, wherein the second shielding element is electrically connected to the shielding element through the conductive structures.

10. The chip package as claimed in claim 6, further comprising a board disposed above the redistribution structure, wherein the shielding element has a first portion covering at least part of a top surface of the board and a second portion penetrating through the board and covering at least part of a bottom surface of the board.

11. A chip package, comprising:
   a redistribution structure;
   a first semiconductor die and a second semiconductor die disposed on the redistribution structure;
   a board disposed above the redistribution structure;
   a shielding element over the first semiconductor die, wherein the shielding element has a first portion positioned on the board and a second portion penetrating through the board, the first portion of the shielding element at least partially overlaps the first semiconductor die but does not overlap the second semiconductor die in a top view, and a bottom surface of the second portion of the shielding element is lower than a bottom surface of the board; and
   a plurality of conductive structures separated from each other, over the redistribution structure, surrounding the first semiconductor die, and electrically connected to the shielding element, wherein a portion of the conductive structures is disposed between the first semiconductor die and the second semiconductor die;
   wherein two of the conductive structures are separated from each other by a distance, and the distance is smaller than half a wavelength of an electromagnetic wave generated by the first semiconductor die.

12. The chip package as claimed in claim 11, wherein the board is disposed between the first portion of the shielding element and the first semiconductor die.

13. The chip package as claimed in claim 12, wherein a portion of the shielding element overlaps the board in a tangent direction of the board.

14. The chip package as claimed in claim 12, wherein a distance between a top surface of the first portion of the shielding element to a top surface of the first semiconductor die is higher than a distance between a top surface of the board and the top surface of the first semiconductor die, and a distance between the bottom surface of the second portion of the shielding element to a bottom surface of the first semiconductor die is less than a distance between the bottom surface of the board and the bottom surface of the first semiconductor die.

15. The chip package as claimed in claim 11, further comprising a plurality of conductive walls separated from each other.

16. The chip package as claimed in claim 15, wherein the conductive structures and the conductive walls are arranged on different sides of the first semiconductor die in the top view.

17. The chip package as claimed in claim 16, wherein in the top view, the conductive structures are arranged on opposite sides of the first semiconductor die, and the conductive walls are arranged on opposite sides of the first semicondctor die.

18. The chip package as claimed in claim 15, wherein a width of the first semiconductor die is less than a width of one of the conductive walls in the top view.

19. The chip package as claimed in claim 11, further comprising a protective layer disposed between the shielding element and the conductive structures.

20. The chip package as claimed in claim 19, wherein the conductive structures are separated from the protective layer.

* * * * *